US008604572B2

(12) United States Patent
Wang et al.

(10) Patent No.: US 8,604,572 B2
(45) Date of Patent: Dec. 10, 2013

(54) MAGNETIC TUNNEL JUNCTION DEVICE

(75) Inventors: Jian-Ping Wang, Shoreview, MN (US); Md. Tofizur Rahman, Falcon Heights, MN (US)

(73) Assignee: Regents of the University of Minnesota, St. Paul, MN (US)

( * ) Notice: Subject to any disclaimer, the term of this patent is extended or adjusted under 35 U.S.C. 154(b) by 227 days.

(21) Appl. No.: 13/160,306

(22) Filed: Jun. 14, 2011

(65) Prior Publication Data

US 2011/0303997 A1    Dec. 15, 2011

Related U.S. Application Data

(60) Provisional application No. 61/354,455, filed on Jun. 14, 2010.

(51) Int. Cl.
*H01L 29/82* (2006.01)
*H01L 21/00* (2006.01)

(52) U.S. Cl.
USPC ............ 257/421; 257/E29.323; 257/E21.665; 438/3

(58) Field of Classification Search
USPC ........................... 257/421, E29.323, E21.665
See application file for complete search history.

(56) References Cited

U.S. PATENT DOCUMENTS

| | | | |
|---|---|---|---|
| 6,967,863 B2 * | 11/2005 | Huai | 365/158 |
| 6,980,469 B2 | 12/2005 | Kent et al. | |
| 7,170,778 B2 | 1/2007 | Kent et al. | |
| 7,307,876 B2 | 12/2007 | Kent et al. | |
| 7,573,737 B2 | 8/2009 | Kent et al. | |
| 7,602,591 B2 * | 10/2009 | Sbiaa et al. | 360/324.12 |
| 7,750,421 B2 * | 7/2010 | Horng et al. | 257/421 |
| 7,936,598 B2 * | 5/2011 | Zheng et al. | 365/173 |
| 7,940,600 B2 * | 5/2011 | Dimitrov et al. | 365/230.07 |
| 8,072,800 B2 * | 12/2011 | Chen et al. | 365/158 |
| 2005/0185455 A1 * | 8/2005 | Huai | 365/171 |

OTHER PUBLICATIONS

Berger, "Emission of Spin Waves by a Magnetic Multilayer Traversed by a Current," Physical Review B, Oct. 1, 1996, pp. 9353-9358, vol. 54, No. 13.

Slonczewski, Letter to the Editor, "Current-Driven Excitation of Magnetic Multilayers," Journal of Magnetism and Magnetic Materials 159, 1996, pp. L1-L7, 159.

Myers et al., "Current-Induced Switching of Domains in Magnetic Multilayer Devices," Science 285, 867, 1999, pp. 866-870.

(Continued)

*Primary Examiner* — Lex Malsawma
(74) *Attorney, Agent, or Firm* — Shumaker & Sieffert, P.A.

(57) ABSTRACT

A magnetic tunnel junction device comprises a fixed magnetic layer having a first side and a second side, the fixed magnetic layer having a magnetic anisotropy that is out of the film plane of the fixed magnetic layer; a stack of a plurality of bilayers adjacent to the first side of the fixed magnetic layer, each bilayer comprising a first layer comprising at least one of cobalt, iron, a CoFeB alloy, or a CoB alloy and a second layer in contact with the first layer, the second layer comprising palladium or platinum, wherein the plurality of bilayers has a magnetic anisotropy that is out of the film plane of each of the bilayers, wherein the fixed magnetic layer is exchange coupled to the stack of the plurality of bilayers, and a tunnel barrier layer in contact with the second side of the fixed magnetic layer.

37 Claims, 14 Drawing Sheets

(56) References Cited

OTHER PUBLICATIONS

Huai et al., "Observation of Spin-Transfer Switching in Deep Submicron-Sized and Low-Resistance Magnetic Tunnel Junctions," Applied Physics Letters, vol. 84, No. 16, Apr. 19, 2004, pp. 3118-3120.

Waintal et al., "Role of Spin-Dependent Interface Scattering in Generating Current-Induced Torques in Magnetic Multilayers," Physical Review B, vol. 62, No. 18, Nov. 1, 2000, pp. 12317-12327.

Xia et al., "Spin Torques in Ferromagnetic/Normal-Metal Structures," Physical Review B, vol. 65, 220401(R), 2002, 4 pages.

Slonczewski, "Currents, Torques, and Polarization Factors in Magnetic Tunnel Junctions," Physical Review B, pp. 024411-1-024411-10, vol. 71, No. 2, 2005.

Hosomi et al., "A Novel Nonvolatile Memory with Spin Torque Transfer Magnetization Switching: Spin-RAM," Digest of the International Electron Devices Meeting (IEDM), 2005, 4 pages.

Diao et al., "Spin Transfer Switching in Dual MgO Magnetic Tunnel Junctions," Applied Physics Letters 90, 2007, pp. 132508-1-132508-3.

Klostermann et al., "A Perpendicular Spin Torque Switching based MRAM for the 28 nm Technology Node," 2007, IEEE, pp. 187-190.

Lin et al., "45nm Low Power CMOS Logic Compatible Embedded STT MRAM Utilizing a Reverse-Connection 1T/1MTJ Cell," 2009, International Electron Devices Meeting (IEDM), pp. 279-282.

Rahman, et al., "High Temperature Annealing Stability of Magnetic Properties in MgO-Based Perpendicular Magnetic Tunnel Junction Stacks with CoFeB Polarizing Layer," Journal of Applied Physics 109, 07C709, 2011, 3 pages.

* cited by examiner

FIG. 7A   FIG. 7B

MAGNETIC TUNNEL JUNCTION DEVICE

This application claims priority to U.S. Provisional Application No. 61/354,455, entitled, "MAGNETIC TUNNEL JUNCTION DEVICE," filed on Jun. 14, 2010, the entire content of which is incorporated herein by reference.

This invention was made with government support under HR0011-09-C-0114 awarded by the Advanced Research Projects Agency. The government has certain rights in the invention.

TECHNICAL FIELD

The disclosure relates to spintronic devices, such as magnetic tunneling junction devices.

BACKGROUND

Magnetic tunneling junctions (MTJs) include a thin oxide barrier, such as a MgO or $Al_2O_3$, separating a ferromagnetic free layer with its magnetization free to rotate and a fixed or pinned layer with its magnetization fixed in space, such as through exchange bias by an antiferromagnetic layer. In these devices, electric current sets the free layer magnetization orientation depending on the current polarity. The resistance through the MTJ depends on the orientation of the free layer relative to the fixed layer due to the tunneling magnetoresistance (TMR) effect.

In existing MTJ devices, such as spin transfer torque magnetic random access memory (STT-MRAM) devices, the direction of magnetization of the free layer and fixed layer are collinear and lie in the film plane of the magnetic layers. In these devices, the initial current-induced torque causing the reversal is very small, and is strongly dependent on magnetization fluctuations due to temperature. This results in large (~5 ns or longer) switching times. This negatively affects both the device speed and its energy dissipation, since the longer switching time (during which current is flowing through the bit) translates into a larger energy dissipated per switching event.

SUMMARY

In general, the invention is directed to a MTJ device having a fixed magnetic layer that has a magnetic anisotropy that is out of the film plane, such as a generally perpendicular magnetic anisotropy, with a tunnel barrier layer on one side of the fixed magnetic layer. A stack of bilayers having a magnetic anisotropy outside the film plane is adjacent to a second side of the fixed magnetic layer. The stack of bilayers and the fixed magnetic layer are exchange coupled to fix the fixed magnetic layer's anisotropy.

In one example, the disclosure is directed to a magnetic tunnel junction device comprising a fixed magnetic layer having a first side and a second side, the fixed magnetic layer having a magnetic anisotropy that is out of the film plane of the fixed magnetic layer; a stack of a plurality of bilayers adjacent to the first side of the fixed magnetic layer, each bilayer comprising a first layer comprising at least one of cobalt, iron, a CoFeB alloy, or a CoB alloy and a second layer in contact with the first layer, the second layer comprising palladium or platinum, wherein the plurality of bilayers has a magnetic anisotropy that is out of the film plane of each of the bilayers, wherein the fixed magnetic layer is exchange coupled to the stack of the plurality of bilayers, and a tunnel barrier layer in contact with the second side of the fixed magnetic layer.

In another example, the disclosure is directed to a method of forming a magnetic tunnel junction device, the method comprising forming a fixed magnetic layer having a first side and a second side, the fixed magnetic layer having a magnetic anisotropy that is out of the film plane of the fixed magnetic layer, forming a stack of a plurality of bilayers adjacent to the first side of the fixed magnetic layer, each bilayer comprising a first layer comprising at least one of cobalt, iron, a CoFeB alloy, or a CoB alloy and a second layer in contact with the first layer, the second layer comprising palladium or platinum, wherein the plurality of bilayers has a magnetic anisotropy that is out of the film plane of each of the bilayers, wherein the fixed magnetic layer is exchange coupled to the stack of the plurality of bilayers, and forming a tunnel barrier layer in contact with the second side of the fixed magnetic layer.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
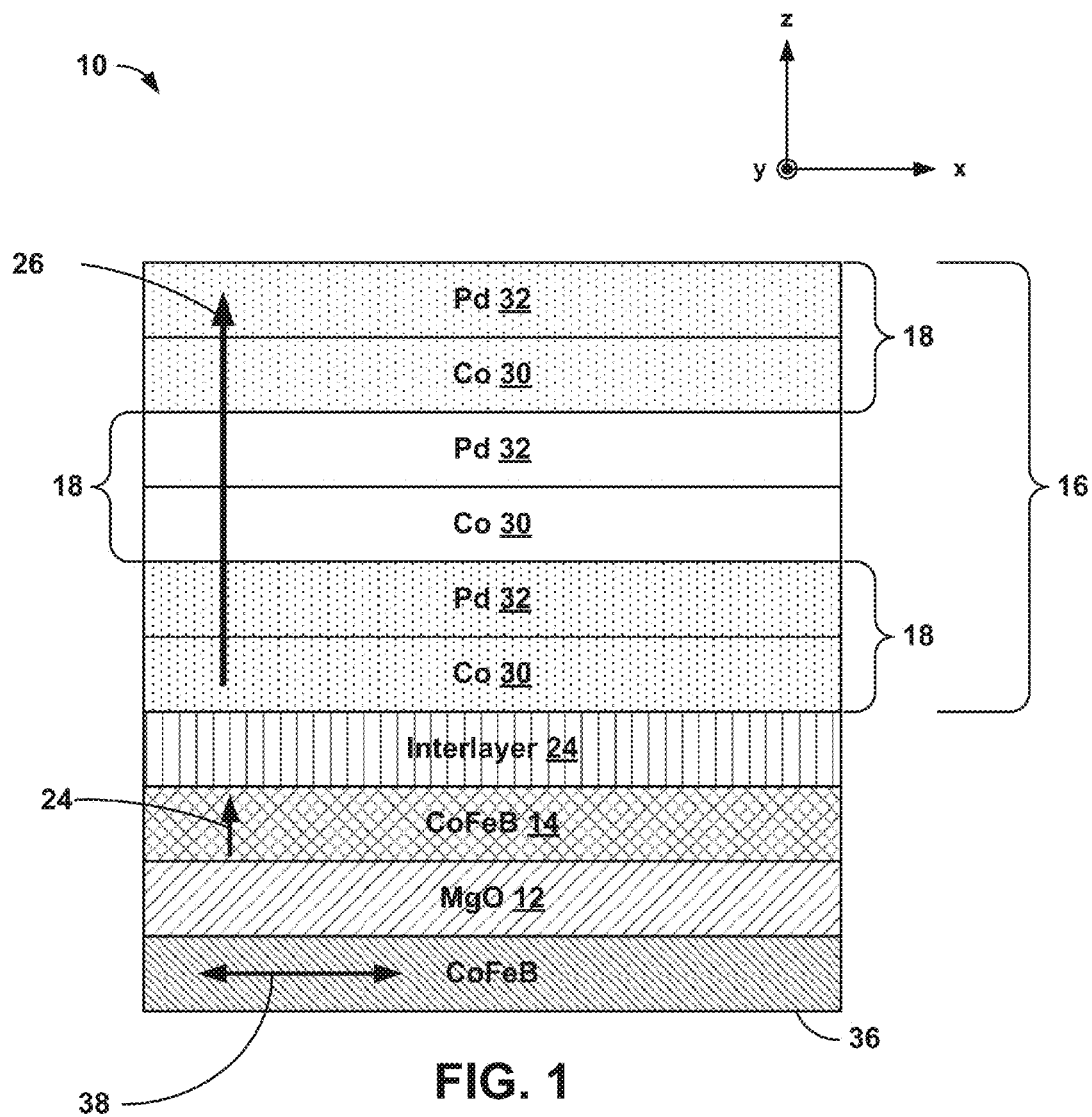
FIG. 1 is a schematic cross-sectional view of an example magnetic tunneling junction device.

FIG. 1 is a schematic diagram illustrating a magnetic tunnel junction device (MTJ) 10. MTJ 10 comprises a tunnel barrier layer 12, a fixed magnetic layer 14 (also referred to as a pinned magnetic layer), and a stack 16 of a plurality of bilayers 18. Fixed magnetic layer 14 has a first side 20 and a second side 22, wherein tunnel barrier layer 12 is in contact with first side 20 while stack 16 of bilayers 18 is adjacent second side 22 of fixed magnetic layer 14. In one example, a thin interlayer 24 is formed between second side 22 of fixed magnetic layer 14 and stack 16 of bilayers 18. In another example, shown in FIG. 2, stack 16 of bilayers 18 is directly in contact with second side 22 of fixed magnetic layer 14.

Figure 2A:
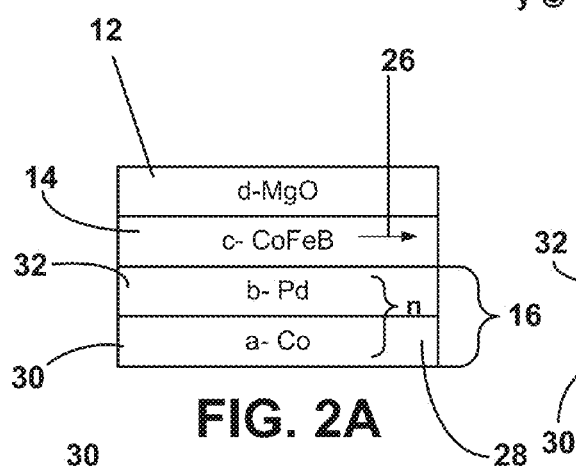
FIG. 2A is a schematic cross-sectional view of another example magnetic tunneling junction device wherein insufficient exchange coupling is created between a stack of bilayers and a fixed magnetic layer.
Figure 2B:
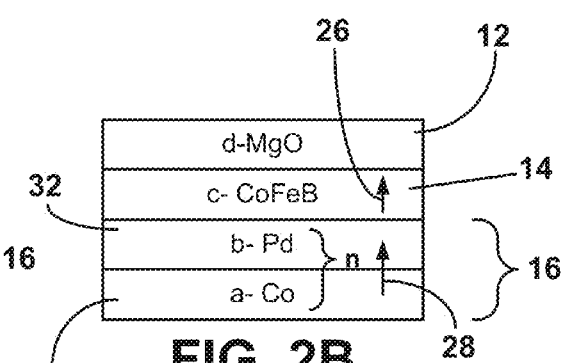
FIG. 2B is a schematic cross-sectional view of the example magnetic tunneling junction device of FIG. 2A with sufficient exchange coupling between the stack of bilayers and the fixed magnetic layer.
Figure 3A:
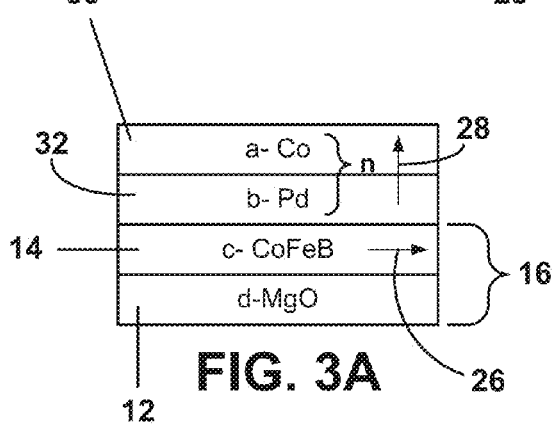
FIG. 3A is a schematic cross-sectional view of another example magnetic tunneling junction device wherein insufficient exchange coupling is created between a stack of bilayers and a fixed magnetic layer.
Figure 3B:
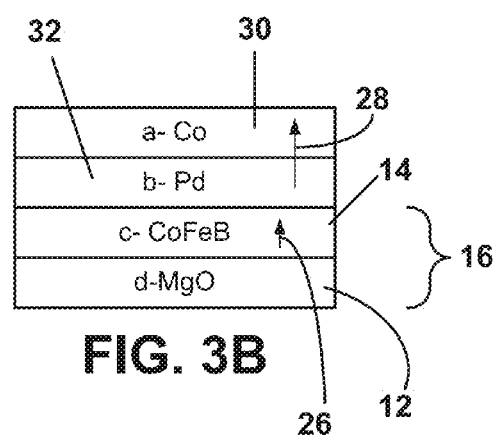
FIG. 3B is a schematic cross-sectional view of the example magnetic tunneling junction device of FIG. 3A with sufficient exchange coupling between the stack of bilayers and the fixed magnetic layer.

Tunnel barrier layer 12 may be deposited over fixed magnetic layer 14 and stack 16 of bilayers 18, as shown in FIGS. 2A and 2B (shown with only one bilayer 18 of the plurality of bilayers 18 that form stack 16). In such an arrangement, fixed magnetic layer 14 and stack 16 form a bottom pinned layer (BPL). Alternatively, fixed magnetic layer 14 and stack 16 of bilayers 18 may be deposited over tunnel barrier layer 12, as shown in FIGS. 3A and 3B, so that fixed magnetic layer 14 and stack 16 forms a top pinned layer (TPL).

Tunnel barrier layer 12 comprises a thin film, e.g., between about 0.5 nanometers and about 2 nanometers, of an electrically insulating material between two ferromagnetic layers. In one example, tunnel barrier layer 12 comprises crystalline magnesium oxide (MgO). In one example, the MgO of tunnel barrier layer 12 has a (001) crystal orientation texture that is formed by annealing MTJ 10 in order to crystallize MgO in this orientation after the MgO layer is formed Annealing of MTJ 10 to crystallize an MgO tunnel barrier layer 12 generally occurs at between about 270° C. and about 350° C., for an extended period of time, such as between about 30 minutes and about 2 hours, for example for about 1 hour. In some examples, tunnel barrier layer 12 includes at least one of ZnO, MgAlO or aluminum oxide, in addition to or as an alternative to MgO.

Fixed magnetic layer 14 comprises a ferromagnetic material having a magnetic anisotropy. As best seen in FIG. 2B, the magnetic anisotropy of fixed magnetic layer 14 (as indicated by arrow 26 shown pointing in the z direction in FIG. 2B) is generally perpendicular to a film plane of fixed magnetic layer 14 (shown as being in the x direction in FIG. 2B). Similarly, stack 16 of bilayers 18 also comprises magnetic materials that form a magnetic anisotropy. As seen in FIG. 2B, the magnetic anisotropy of stack 16 of bilayers 18 (as indicated by arrow 28 shown pointing in the z direction in FIG. 2B) is generally perpendicular to a film plane of each bilayer 18 (shown as being in the x direction in FIG. 2B). Fixed magnetic layer 14 and stack 16 of bilayers 18 have strong perpendicular anisotropy so that subsequent energization of MTJ 10 will not alter the perpendicular direction of magnetization of fixed magnetic layer 14 and stack 16 of bilayers 18. In one example, stack 16 of bilayers 18 has an anisotropy constant between about $2 \times 10^6$ erg/cm$^3$ and about $5 \times 10^6$ erg/cm$^3$.

The strong perpendicular anisotropy of stack 16 of bilayers 18 is formed by the interaction between the materials of the layers of each bilayer. In one example, shown in FIG. 1, each bilayer 18 comprises a cobalt (Co) layer 30 and a palladium (Pd) layer 32 in contact with one another. In another example, each bilayer 18 may comprise a layer comprising cobalt and a layer comprising platinum (Pt). In another example, each bilayer 18 comprises a layer comprising iron (Fe) and a layer comprising palladium. In yet another example, each bilayer 18 comprises a layer comprising $L1_0$ iron ($L1_0$ Fe) and a layer comprising platinum. In other examples, bilayer 18 may comprise a layer comprising an alloy, such as a CoFeB alloy or a CoB alloy, and a layer comprising palladium. Stack 16 comprises a plurality of bilayers 18 stacked sequentially. In one example, stack 16 comprises between 1 and 10 bilayers 18, such as between 3 and 8 bilayers. In the example shown in FIG. 1, stack 16 comprises three bilayers 18, each comprising a Co layer 30 and a Pd layer 32.

Strong perpendicular anisotropy within stack 16 of bilayers 18 has been found when the ratio between the thickness of each Co layer 30 and the thickness of each Pd layer 32 is tuned. In one example, strong perpendicular anisotropy of stack 16 was achieved with a thickness of each Co layer 30 of between about 0.2 nanometers and about 0.4 nanometers, such as between about 0.25 nanometers and about 0.35 nanometers and a thickness of each Pd layer of between about 0.9 nanometers and about 1.5 nanometers, such as between about 1.0 nanometers and about 1.4 nanometers. In one example, the ratio between the thickness of Co layers 30 and Pd layers 32 is selected to be between about 0.15:1 (about 3:20) and about 0.4:1 (about 2:5), for example a ratio of Co layer 30 thickness to Pd layer 32 thickness of about 0.25:1 (about 1:4). In one example, the ratio between the thickness of Co layers 30 and Pd layers 32 is between about 0.25:1 and about 0.35:1. In another example, the ratio is between about 0.17:1 and about 0.25:1. In yet another example, the ratio is between about 0.25:1 (about 1:4) and about 0.35:1 (about 7:20). The crystal orientation texture of Co layers 30 and Pd layers 32 may also influence the anisotropy of the resulting stack 16. In one example, Co layers 30 and Pd layers have a (111) crystal orientation texture.

It has also been found that the pressure at which the layers of bilayers 18 are deposited may affect the magnetic anisotropy of stack 16 of bilayers 18. In one example, the deposition pressure of the layers of bilayers 18 is maintained at below about 2.5 mTorr, such as below about 2 mTorr.

As described above, in some examples, a CoFeB layer 14 with high spin polarization ratio is formed by annealing the stacks at temperatures as high as 350° C. for about an hour or more in order to anneal the CoFeB into a (002) orientation. This high annealing temperature may tend to cause stack 16 of bilayers 18 to lose its strong perpendicular anisotropy. For this reason, in one example, stack 16 of bilayers 18 is configured to withstand the high annealing temperatures associated with annealing CoFeB layer 14. Although not wishing to be limited to any one theory, the inventors believe the ratio of the thickness of Co layers 30, having a thickness of between about 0.2 nanometers and about 0.4 nanometers, such as between about 0.25 nanometers and about 0.35 nanometers, to the thickness of Pd layers 32, having a thickness of between about 0.9 nanometers and about 1.5 nanometers, such as between about 1 nanometer and about 1.4 nanometers, provides stack 16 of bilayers 18 with increased resistance to annealing temperatures of up to about 350° C. It is also believed that a sharp or substantially defect-free interface between layer 30 and layer 32 also contributes to the resistance to high temperature annealing. A sharp and substantially defect-free interface may be achieved by setting the deposition pressure of layers 30 and 32 to as low as about 1.5 mTorr.

Strong perpendicular anisotropy in fixed magnetic layer 14 is formed through exchange coupling between fixed magnetic layer 14 and stack 16 of bilayers 18. Exchange coupling occurs due to an energy competition between fixed magnetic layer 14 and stack 16. The energy competition is represented by Equation 1:

$$E_{Total}=E_{Ex}+E_{s,bilayers}+E_{s,FML}+E_{A,bilayers} \quad [1]$$

$E_{Total}$ is the total magnetic energy in the system. $E_{Ex}$ is the exchange coupling energy between fixed magnetic layer 14 and stack 16 of bilayers 18, which is affected by the materials of fixed magnetic layer 14 and stack 16, as well as the presence or absence of an interlayer 24 (described below), the material of interlayer 24 (if present), and the thickness of interlayer 24 (if present). $E_{s,\ bilayers}$ is the magnetic static energy of stack 16 of bilayers 18, which is proportional to the total thickness of stack 16 of bilayers 18 and to the ratio between the thickness of Co layers 30 and the thickness of Pd layers 32. In one example, $E_{s,\ bilayers}$ increases as the thickness of Co layers 30 are increased. $E_{s,\ FML}$ is the magnetic static energy of fixed magnetic layer 14, which is proportional to the thickness of fixed magnetic layer 14 and to the saturation magnetization ($M_s$) of the material of fixed magnetic layer 14. In one example, $E_{s,\ FML}$ increases as the $M_s$ of fixed magnetic layer 14 increases. In one example, wherein fixed magnetic layer 14 is a CoFeB layer 14, the $M_s$ is affected by the compositional proportion of the Co, Fe, and B within layer 14. $E_{A,\ bilayers}$ is the magnetic anisotropy energy of stack 16 of bilayers 18. In one example, $E_{A,\ bilayers}$ is affected by the thickness of Co layers 30, the sharpness of the interface between Co layers 30 and Pd layers 32. In one example, $E_{A,\ bilayers}$ generally increases as the thickness of Co layers 30 decreases, but in one example $E_{A,\ bilayers}$ begins to decrease when the thickness of Co layers falls below about 0.24 nanometers. The ratio of the thicknesses of Co layers 30 and Pd layers 32 also affects $E_{A,\ bilayers}$.

As can be seen from Equation 1, in order for fixed magnetic layer 14 to have the desired strong perpendicular magnetic anisotropy, the perpendicular anisotropy of stack 16 of bilayers 18 (as reqpresented by the magnetic anisotropy energy of stack 16, $E_{A,\ bilayers}$, in Equation 1) and the exchange coupling (represented by the exchange coupling energy, $E_{Ex}$, in Equation 1) must be strong enough to overcome the demagnetization field created within fixed magnetic layer 14 (as represented by the magnetic static energy of fixed magnetic layer 14, $E_{s,\ FML}$, in Equation 1). If sufficient exchange coupling is not created between stack 16 and fixed magnetic layer 14, then the demagnetization field of fixed magnetic layer 14 may not be overcome, and fixed magnetic layer 14 may remain with a magnetic anisotropy that is in the film plane, such as in the examples shown in FIGS. 2A and 3A.

Although strong exchange coupling between fixed magnetic layer 14 and stack 16 of bilayers 18 is necessary to ensure fixed magnetic layer 14 has a generally perpendicular magnetic anisotropy, the exchange coupling between fixed magnetic layer 14 and stack 16 of bilayers 18 should not be so strong as to interfere with the spin polarization of current passing through tunnel barrier layer 12, which would interfere with the tunneling magnetoresistance (TMR) effect. For this reason, the energy competition represented by Equation 1 is balanced in order to form an optimal exchange coupling between fixed magnetic layer 14 and stack 16 of bilayers 18. In one example, the exchange coupling energy between fixed magnetic layer 14 and stack 16 of bilayers 18 is between about $1\times10^{-13}$ J/m and about $1\times10^{-11}$ J/m, such as about $1\times10^{-12}$ J/m, which may be measured by using a vibrating sample magnetometer.

In one example, balancing the energy competition of Equation 1 between fixed magnetic layer 14 and stack 16 of bilayers 18 includes tuning the total thickness of stack 16 of bilayers 18, which affects the perpendicular anisotropy of stack 16, the ratio between the thickness of Co layers 30 and the thickness of Pd layers 32 within the bilayers 18, the saturation magnetization, $M_s$, of stack 16 of bilayers 18 and of fixed magnetic layer 14, and the thickness of fixed magnetic layer 14. In one example, stack 16 of bilayers 18 has a thickness between about 4 nanometers and about 19 nanometers, such as between about 4 nanometers and about 13 nanometers. Co layers 30 within bilayers 18 each have a thickness of between about 0.2 nanometers and about 0.4 nanometers, such as between about 0.25 nanometers and about 0.35 nanometers and a thickness of each Pd layer of between about 0.9 nanometers and about 1.5 nanometers, such as between about 1.0 nanometers and about 1.4 nanometers. Fixed magnetic layer 14, which may comprise a CoFeB alloy, has a saturation magnetization of between about 700 emu/cm$^3$ and about _900 emu/cm$^3$, such as between about 750 emu/cm$^3$ and about 850 emu/cm$^3$, and fixed magnetic layer 14 has a thickness of between about 0.8 nanometers and about 1.6 nanometers, such as between about 0.88 nanometers and about 1.5 nanometers. Interlayer 24, if present, may also affect the exchange coupling between fixed magnetic layer 14 and stack 16 of bilayers 18 by spacing fixed magnetic layer 14 apart from stack 16. The thickness of interlayer 24 may be tuned to achieve a desired exchange coupling. In one example, interlayer 24 has a thickness of between about 0.3 nanometers and about 0.6 nanometers.

Figures 4A, 4B, 4C:
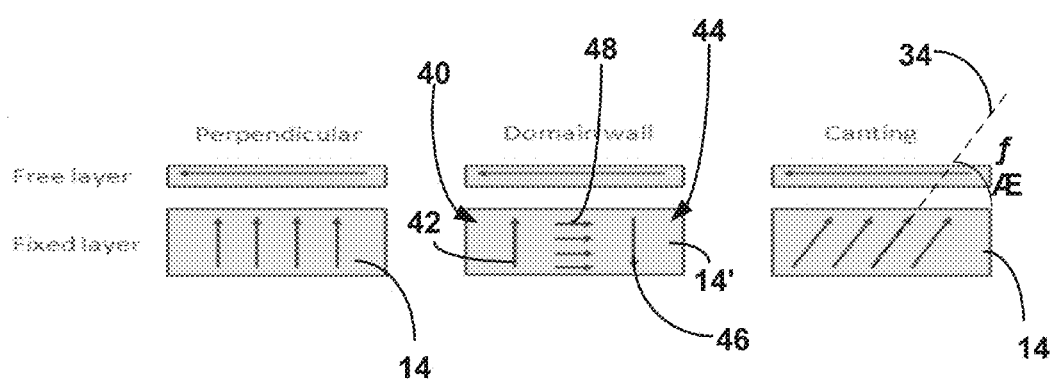
FIGS. 4A-4C show the formation of various example anisotropy orientations of a fixed magnetic layer.

Although the magnetic anisotropies of fixed magnetic layer 14 and stack 16 of bilayers 18 have been described up to this point as "generally perpendicular" to the film plane of fixed magnetic layer 14 and stack 16, the magnetic anisotropy of these layers need not be totally perpendicular. Although a generally perpendicular magnetic anisotropy may be preferred for some applications, in some examples, the magnetic anisotropy of fixed magnetic layer 14 may be canted (FIG. 4C) as compared to a totally perpendicular magnetic anisotropy of fixed magnetic layer 14 (as in FIG. 4A). The magnetic anisotropy of fixed magnetic layer 14 may be defined by the angle θ that is formed between the direction of the magnetic anisotropy of fixed magnetic layer 14 (also referred to as the easy axis 34 of fixed magnetic layer 14, as shown in FIG. 4C) and the film plane of fixed magnetic layer 14. The angle θ of canting between easy axis 34 and the film plane is determined by several factors, including the total thickness of stack 16 of bilayers 18 (which tends to increase the angle θ of canting as the thickness increases), the thickness ratio between Co layers 30 and Pd layers 32 (which tends to increase the canting angle θ as the ratio of Co layer 30 thickness to Pd layer 32 thickness decreases, leading to a larger magnetic anisotropy), the thickness of fixed magnetic layer 14 (which tends to decrease the angle θ as the thickness of fixed magnetic layer 14 increases), and the exchange coupling between stack 16 of bilayers 18 and fixed magnetic layer x (which tends to increase the angle θ as the exchange coupling is increased). In one example, the easy axis of fixed magnetic layer 14 may be canted at an angle θ of between about 45° and about 90°, such as between about 65° and about 90°, for example between about 75° and about 90°, such as between about 80° and about 90°.

As shown in FIG. 1, MTJ 10 may also comprise a second magnetic layer 36 that is in contact with tunnel barrier layer 12 on a side opposite fixed magnetic layer 14. Second magnetic layer 36, also referred to as a free magnetic layer 36, comprises a ferromagnetic material with a direction of magnetization that is free to rotate under application of a sufficiently strong external magnetic field and change between a first state, wherein the direction of magnetization points in a first direction, and a second state, wherein the direction of magnetization points in a different, second direction. In one example, the direction of magnetization of free magnetic layer 36 (represented by arrow 38 in FIG. 1) is aligned generally along the film plane of free magnetic layer 36 (shown in the x direction of FIG. 1). The direction of magnetization 38 may point in a first direction, such as to the left as shown by arrow 38 in FIG. 1, or in a second direction, such as to the right as shown by arrow 38 in FIG. 1, and can be set to either the first direction and the second direction by applying a electrical current through MTJ 10, wherein the direction that the direction of magnetization is set depends on the polarity of the current through MTJ 10. In some examples, free magnetic layer 36 may include a CoFeB alloy, similar to or substantially the same as fixed magnetic layer 14. In some examples, the direction of magnetization 38 may be out of x-y plane of free magnetic layer 36, such as canted or oriented substantially along the z-axis of FIG. 1.

The tunnel barrier layer 12 and the relative orientation of free magnetic layer 36 and fixed magnetic layer 14 creates a difference in the electrical resistance of MTJ 10, known generally as the tunneling magnetoresistance (TMR) effect. For example, when the direction of magnetization of free magnetic layer 36 is pointing in the first direction, a first, low resistance may be experienced by MTJ 10, while a second, high resistance may be experienced by MTJ 10 when the direction of magnetization of free magnetic layer 36 is pointed in the second direction. The difference between the high resistance and the low resistance can be characterized as the magnetoresistance (MR) ratio, which is defined by Equation 2.

$$MR \text{ Ratio} = \frac{R_{High} - R_{Low}}{R_{Low}} \quad [2]$$

It is preferred that the MR ratio of MTJ 10 be as high as possible because high MR ratio is equitable to more efficient performance of MTJ 10. For example, as described below, MTJ 10 may be used, among other things, as part of a spin transfer torque magnetic random access memory device (STT MRAM), as a spin oscillator, or as a magnetic sensor. When used in a STT MRAM, a higher MR ratio allows for less writing energy and a shorter switching time. When used in a spin oscillator, a higher MR ratio allows the device to generate more power. When used in a magnetic sensor, a higher MR ratio will allow the sensor to be more sensitive.

In one example, MTJ 10 has an MR ratio of between about 30% and about 75%, such as between about 30% and about 60%.

Several parameters of MTJ 10 provide for a higher MR ratio. In one example, the crystal orientation of tunnel barrier layer 12, such as an MgO tunnel barrier layer 12, affects the MR ratio of MTJ 10. As described above, in some examples, the MgO material of tunnel barrier layer 12 is annealed at high temperatures, such as between about 300° C. and about 350° C., for extended periods of time, such as between about 30 minutes and about 1.5 hours, in order to crystallize the MgO material in a (001) orientation. The uniformity of the (001) crystal orientation has been found to be critical in achieving high MR ratio devices. In some examples, tunnel barrier layer 12 includes at least one of ZnO, MgAlO or aluminum oxide, in addition to or as an alternative to MgO.

It has also been found that the crystal orientation of fixed magnetic layer 14 may also be important in achieving a high MR ratio for MTJ 10. In one example, wherein fixed magnetic layer 14 comprises a CoFeB alloy, a high MR ratio of 30% or greater, it is preferred that the crystal orientation of fixed magnetic layer 14 be a (001) orientation. As described in more detail below, in one example, a FeCoB fixed magnetic layer 14 may be deposited in an amorphous, non-crystalline state. During the annealing step to anneal tunnel barrier layer 12 into the desired (001) orientation, fixed magnetic layer 14 may be crystallized into either a (110) orientation that is templated from stack 16 of bilayers 18, which as described above have a (111) crystal orientation, or into a (001) orientation templated from tunnel barrier layer 12. In some cases, there may be a competition between these two crystal orientations within fixed magnetic layer 14.

In one example, shown in FIG. 1, an interlayer 24 may be included between fixed magnetic layer 14 and stack 16 of bilayers 18. A material from which interlayer 24 may be formed may be selected based on one or more of a number of considerations. For example, the material from which interlayer 24 is formed may be selected to reduce or eliminate the templating of (111) orientation from stack 16 of bilayers 18 to fixed magnetic layer 14 (e.g., when interlayer 24 is formed on stack 16 and fixed magnetic layer 14 is formed on interlayer 24). Conversely, the material from which interlayer 24 is formed may be selected to not substantially affect the (111) orientation of bilayers 18, which provides perpendicular magnetic anisotropy in bilayers 18, as described above. In the examples where fixed magnetic layer 14 comprises a CoFeB alloy, it has been found that diffusion of boron from the CoFeB alloy fixed magnetic layer into adjacent layers of stack 16 may lead to crystallization in the (110) direction. In some examples, the material of interlayer 24 is chosen to have a solubility of boron that is lower than the solubility in palladium (the higher boron-soluble metals of stack 16), to reduce or prevent migration of boron from a fixed magnetic layer 14 that includes CoFeB to stack 16. In this way, interlayer 24 may act as a boron sink. Additionally, in some examples, the material from which interlayer 24 is formed may be selected to have a larger atomic radius than Co or Fe, which may reduce or substantially eliminate diffusion of the material of interlayer 24 into fixed magnetic layer 14 (when fixed magnetic layer 14 includes Co or Fe). Materials that tend to enhance (001) crystal orientation in fixed magnetic layer 14 may also be chosen. Materials that may satisfy at least one of the above considerations include cobalt (Co), tantalum (Ta), ruthenium (Ru), a cobalt-iron (CoFe) alloy, chromium (Cr), or alloys including at least one of these materials. Accordingly, in some examples, interlayer 24 comprises at least one of Co, Ta, Ru, a CoFe alloy, or Cr.

It has also been found that the formation of multiple magnetic domains within fixed magnetic layer 14 may lead to a lower MR ratio for a MTJ. An example of a multi-domain fixed magnetic layer 14' is shown in FIG. 4B, wherein a first region 40 of fixed magnetic layer 14' has a direction of magnetization in a first direction (as shown by arrow 42 pointing upward in FIG. 4B) while a second region 44 has a direction of magnetization in a second direction (as shown by arrow 46 pointing downward in FIG. 4B). A domain wall 48 is formed between first region 40 and second region 44. MTJ 10 of the present disclosure is configured to maintain a single domain state in stack 16 of bilayers 18 and in fixed magnetic layer 14 in order to maintain a high MR ratio for MTJ 10. The single domain state has been achieved by patterning MTJ 10 down to a size of less than the critical size for domain formation. In one example, the critical size for domain formation within the Co layers 30 and Pd layers 32 of bilayers 18 is between about 150 nanometers and about 80 nanometers, such as about 100 nanometers. In one example, a high MR ratio of more than 50% was obtained with an element size of less than 60 nm, which is well below the critical size of domain formation in Co—Pd bilayers 18. The critical size of the domain formation can be pushed to higher value by decreasing the saturation magnetization value of stack 16 of bilayers 18. In one example, wherein each bilayer 18 comprises a Co layer 30 and a Pd layer 32, the saturation magnetization value of stack 16 of Co—Pd bilayers 18 has been reduced to about 300 emu/cm$^2$ or less by tuning the individual layer thickness of Co layers 30 to be about 0.25 nm and the individual layer thickness of Pd layers 32 to be about 1.0 nm. Single domain state can also be attained by pinning stack 16 of bilayers 18 with an antiferromagnetic layer, such as one comprising PtMn or FeMn, or by replacing the materials in stack 16 of bilayers 18 with materials having a stronger perpendicular anisotropy, such as $L1_0$ FePt or FePd.

In some examples, it may be desired to reduce a size of MTJ 10, e.g., in a direction of the x-axis and/or y-axis of FIGS. 1, 2 and 3. By reducing a size of MTJ 10 in the direction of the x-axis and/or y-axis, a greater number of MTJs 10 may be fit in a similar volume (i.e., may increase a density of MTJs 10 within a device). In some examples, this may facilitate an increase in a storage density of a magnetic random access memory (MRAM) device or a transistor density of a magnetic logic device. Increasing a density of MTJs 10 in a device also may result in reduced device costs, e.g., due to reduced manufacturing costs.

However, when a size of MTJ 10 is reduced in the x-axis and/or y-axis, this reduces a volume of free magnetic layer 36 for a given thickness of free magnetic layer 36, which may reduce a thermal stability of the magnetic orientation within free magnetic layer 36. While not wishing to be bound by theory, this is believed to be because the thermal stability of free magnetic layer 36 is proportional to the volume of the layer. One potential way to improve thermal stability of the magnetic orientation within free magnetic layer 36 without increasing a volume of free magnetic layer 36 is to use a magnetic material having a higher magnetic anisotropy; however, this may necessitate a higher electrical current to switch the orientation of free magnetic layer 36. Another potential way to improve thermal stability of the magnetic orientation within free magnetic layer 36 is to increase a thickness of free magnetic layer 36; however, this also may necessitate a higher electrical current to switch the orientation of free magnetic layer 36.

Figure 5:
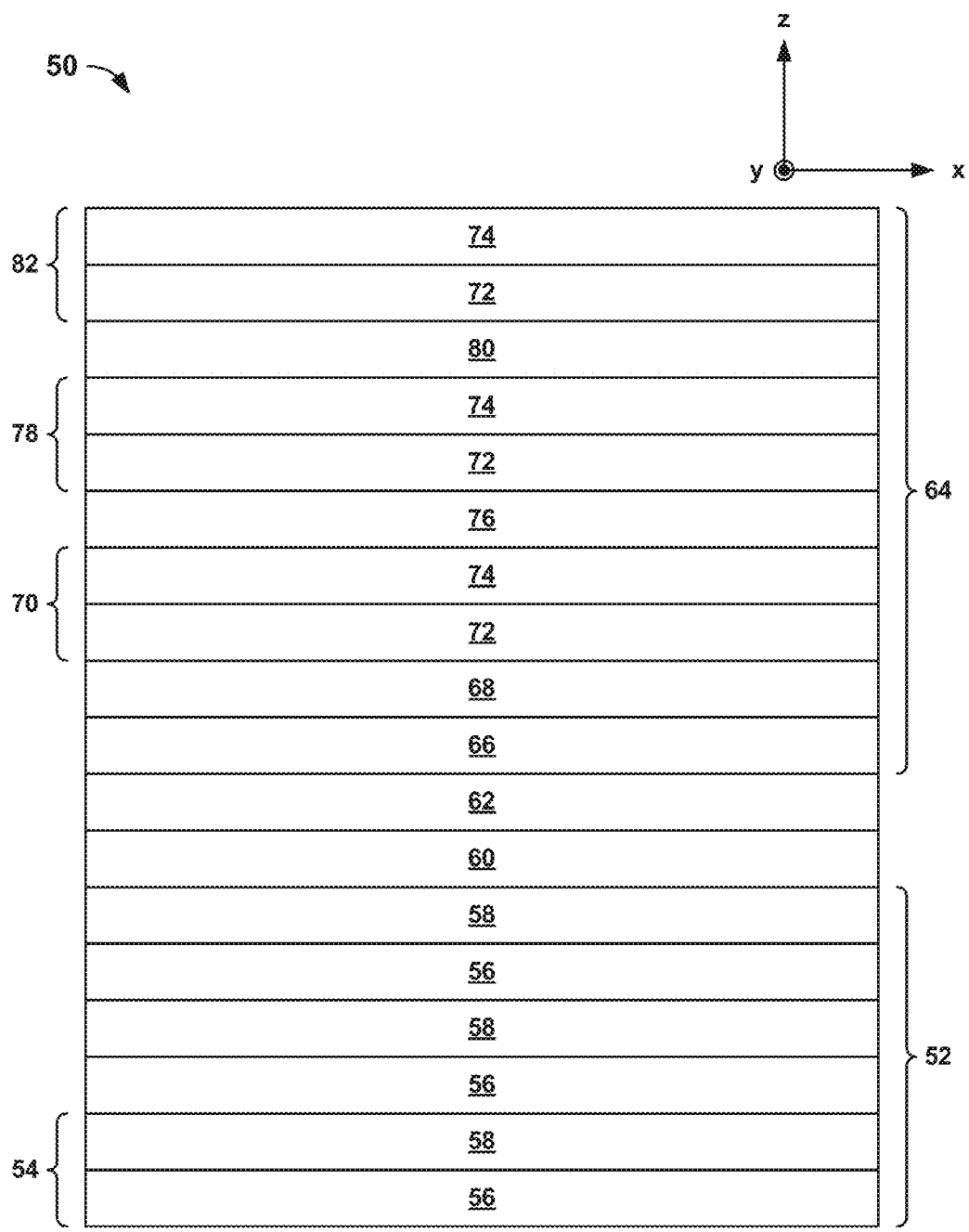
FIG. 5 is a schematic cross-sectional view of an example magnetic tunneling junction device that includes a free magnetic multilayer.

In accordance with some aspects of the current disclosure, free magnetic layer 36 may incorporate a graded magnetic anisotropy. This may facilitate thermal stability of free magnetic layer 36 while allowing use of a relatively low switching current to switch the orientation of free magnetic layer 36. FIG. 5 is a schematic cross-sectional view of an example MTJ FIG. 5 that includes a free magnetic layer including graded magnetic anisotropy. MTJ 50 includes a stack 52 of bilayers 54 and a fixed magnetic layer 60 that together have a magnetic anisotropy oriented out of the x-y plane of FIG. 5. For example, the magnetic anisotropy of stack 52 of bilayers 54 may be oriented substantially along the z-axis of FIG. 5 or may be canted out of the x-y plane, as described above. Stack 52 may be similar to or substantially the same as stack 16 described above, bilayers 54 may be similar to or substantially the same as bilayers 18 described above, and fixed magnetic layer 60 may be similar to or substantially the same as fixed magnetic layer 24 described above. For example, although FIG. 5 illustrates stack 52 as including three bilayers 54, stack 52 can include between 1 and 10 bilayers 54, such as between 3 and 8 bilayers 54.

MTJ 50 also includes tunnel barrier layer 62, which may be similar to or substantially the same as tunnel barrier layer 12 described above. For example, tunnel barrier layer 62 may include at least one of MgO, ZnO, MgAlO, or aluminum oxide.

MTJ further includes a free magnetic multilayer 64 formed on tunnel barrier layer 62. Free magnetic multilayer 64 includes a free magnetic layer 66, which may be similar to or substantially the same as free magnetic layer 36. For example, free magnetic layer 66 may include a FeCoB alloy. Free magnetic multilayer 64 further includes a first interlayer 68 located between free magnetic layer 66 and a first bilayer 70, a second interlayer 76 located between first bilayer 70 and a second bilayer 78, and a third interlayer 80 located between second bilayer 78 and a third bilayer 82. Each of first bilayer 70, second bilayer 78, and third bilayer 82 includes a first layer 72 and a second layer 74. Although first layer 72 and second layer 74 are illustrated in FIG. 5 as being the same in each of bilayers 70, 78, 82, in some examples, the composition and/or thickness of first layer 72 may be different in at least one of bilayers 70, 78, 82 than in at least one other of bilayers 70, 78, 82. Similarly, the composition and/or thickness of second layer 74 may be different in at least one of bilayers 70, 78, 82 than in at least one other of bilayers 70, 78, 82.

First interlayer 68, second interlayer 76 and third interlayer 80 may include the same material or a different materials. The material or materials of interlayers 68, 76, 80 may be selected based on at least some of the same considerations described above with respect to interlayer 24. For example, the material from which first interlayer 68 is formed may be selected to reduce or eliminate the templating of (111) orientation from first bilayer 70 to free magnetic layer 66 or vice versa, depending on the order or formation of the layers. As another example, the material from which first interlayer 68 is formed may be selected to reduce or prevent migration of boron from a free magnetic layer 66 that includes CoFeB to first bilayer 70. Additionally or alternatively, in some examples, the material from which interlayer 24 is formed may be selected to have a larger atomic radius than Co or Fe, which may reduce or substantially eliminate diffusion of the material of first interlayer 68 into free magnetic layer 66 (when free magnetic layer 66 includes Co or Fe).

The material from which interlayers 68, 76, 80 are formed and the thickness interlayers 68, 76, 80 of may also be selected to provide properties to free magnetic multilayer 64.

For example, interlayers 68, 76, 80 may facilitate tuning the exchange coupling between free magnetic layer 66 and first bilayer 70, between first bilayer 70 and second bilayer 78, and between second bilayer 78 and third bilayer 82. In some examples, the thickness and/or composition of interlayers 68, 76, 80 may be selected to provide lower perpendicular magnetic anisotropy in the free magnetic layer 66 and increasing anisotropy as the free magnetic multilayer 64 ascends (i.e., perpendicular magnetic anisotropy is greater in third bilayer 82 that in second bilayer 78, greater in second bilayer 78 than in first bilayer 70, and greater in first bilayer 70 than in free magnetic layer 66). In some examples, this may be accomplished by forming first interlayer 68 with a thickness greater than second interlayer 76 and forming second interlayer 76 with a thickness greater than third interlayer 80. For example, first interlayer 68 may define a thickness between about 0.5 nm and about 0.8 nm; second interlayer 76 may define a thickness between about 0.4 nm and 0.7 nm; and third interlayer 80 may define a thickness between about 0.2 nm and about 0.5 nm.

Additionally or alternatively, the materials from which first interlayer 68, second interlayer 76, and third interlayer 80 are formed may be selected such that the first interlayer 68 provides lower exchange coupling between free magnetic layer 66 and first bilayer 70 than second interlayer 76 provides between first bilayer 70 and second bilayer 78, and second interlayer 76 provides lower exchange coupling between first bilayer 70 and second bilayer 78 than third interlayer 80 provides between second bilayer 78, and third bilayer 82.

In general, first interlayer 68, second interlayer 76, and third interlayer 80 may include at least one of Ru, Au, Ta, Cr, or alloys of these metals and at least one other element.

In some examples, materials from which first layer 72 and second layer 74 are formed, deposition parameters used to form first layer 72 and second layer 74, and thicknesses of first layer 72 and second layer 74 may also be selected to provide the determined perpendicular anisotropy gradient. For example, perpendicular anisotropy of the bilayers 70, 78, 82 may be affected by the deposition pressure used during deposition of first layer 72 and second layer 74 of each of bilayers 70, 78, 82. In some implementations, perpendicular anisotropy of bilayers 70, 78, 82 decreases with increasing deposition pressure (for a given material composition and layer thickness). The deposition pressure may be between about 1 mTorr and about 30 mTorr.

As another example, the thicknesses (and thickness ratio) of first layer 72 and/or second layer 74 may be controlled throughout first bilayer 70, second bilayer 78, and/or third bilayer 82. In some examples, the thicknesses and thickness ratios of first layer 72 and second layer 74 in at least one of first bilayer 70, second bilayer 78, and third bilayer 82 may fall within the range of thicknesses and thickness ratios described above with respect to Co layer 30 and Pd layer 32.

In general, first layer 72 may include at least one of Co, Fe, $L1_0$ Fe, CoFeB, or CoB, while second layer 74 may include at least one of Pd or Pt. In some examples, the composition of first layer 72 and second layer 74 may be switched, such that first layer 72 includes at least one of Pd or Pt, and second layer 74 includes at least one of Co, Fe, $L1_0$ Fe, CoFeB, or CoB.

Although FIG. 5 illustrates three interlayers 68, 76, 80 and three bilayers 70, 78, 82, in other examples, MTJ 50 may include between 1 and 10 bilayers and a between 1 and 10 interlayers. For example, MTJ 50 may include between 3 and 8 bilayers and between 3 and 8 interlayers. In some examples, MTJ 50 may include the same number of interlayers and bilayers, such that MTJ 50 includes an interlayer between each bilayer, and an interlayer between the free magnetic layer and the first bilayer (as shown, e.g., in FIG. 5). In other examples, MTJ 50 may include fewer interlayers than bilayers, such that at least one bilayer is formed directly adjacent to another bilayer and/or a bilayer is formed directly adjacent to the free magnetic layer.

Figure 6:
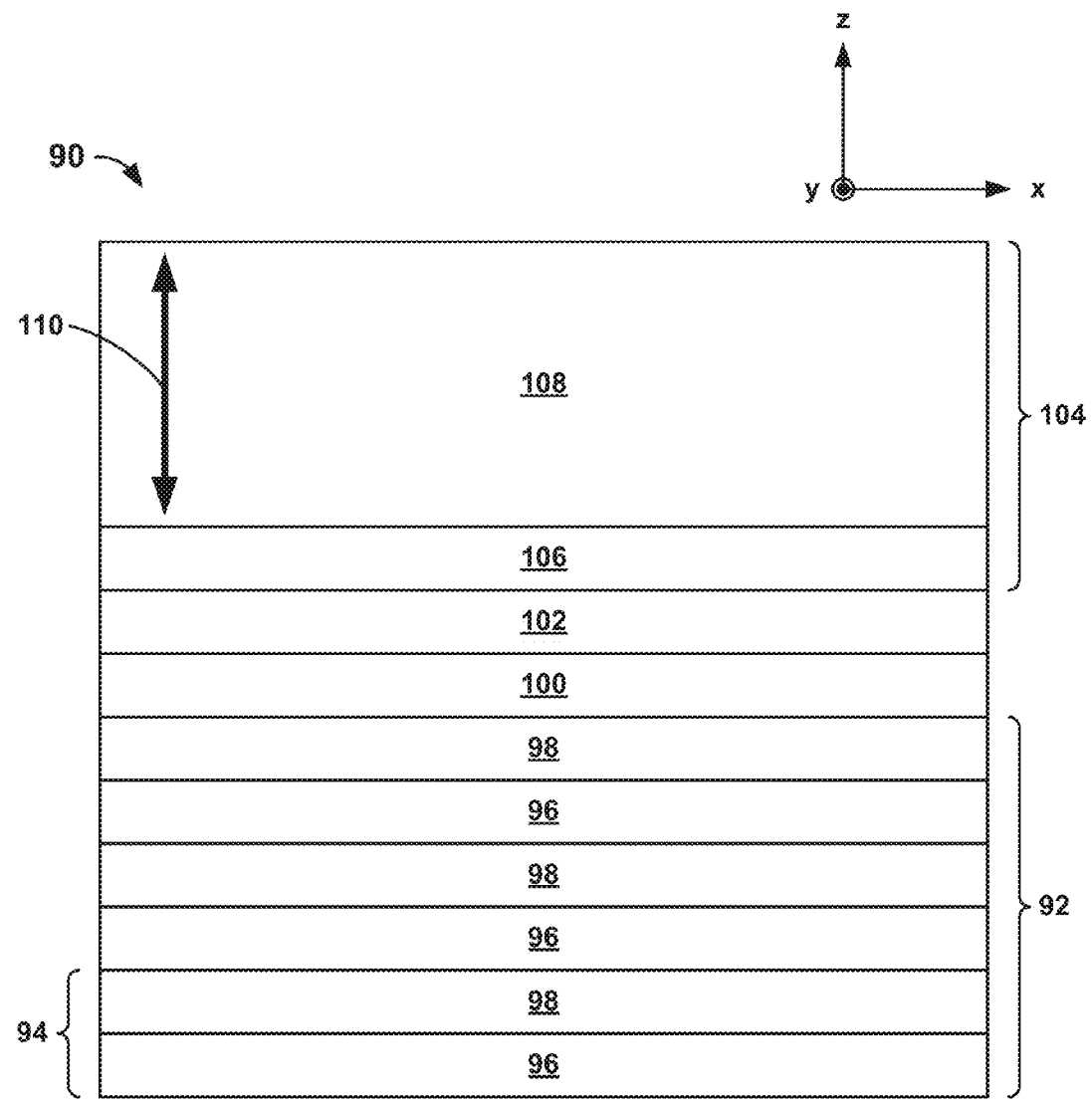
FIG. 6 is a schematic cross-sectional view of an example magnetic tunneling junction device that includes a graded free magnetic structure.

In another example, instead of a free magnetic multilayer including a plurality of bilayers and interlayers between adjacent bilayers, a free magnetic multilayer may include at least layer having graded magnetic anisotropy. FIG. 6 is a schematic cross-sectional view of an example MTJ 90 that includes a free layer structure 104 including a graded layer 108 having graded magnetic anisotropy. Similar to MTJ 50 of FIG. 5, MTJ 90 includes a stack 92 of bilayers 94. Each of bilayers 94 includes a first layer 96 and a second layer 98. The example MTJ 90 shown in FIG. 6 includes three bilayers 94, but similar to stack 16 and stack 52, stack 92 can include between 1 and 10 bilayers 94, such as between 3 and 8 bilayers 94. In general, stack 92, bilayers 94, first layers 96, and second layers 98 may be similar to or substantially the same as stack 16 or stack 52, bilayers 18 or bilayers 54, Co layer 30 or first layers 56, and Pd layer 32 or second layers 58, respectively.

MTJ 90 also includes a fixed magnetic layer 100, which may be the similar to or substantially the same as fixed magnetic layer 14 and/or fixed magnetic layer 60. Although not shown in FIG. 6, in some examples, MTJ 90 includes an interlayer between stack 92 and fixed magnetic layer 100. The interlayer may be similar to or substantially the same as interlayer 24 and/or interlayer 60.

MTJ 90 further includes tunnel barrier layer 102 between fixed magnetic layer 100 and free magnetic layer 106. Tunnel barrier layer 102 may be similar to or substantially the same as tunnel barrier layer 12 and/or tunnel barrier layer 62. For example, tunnel barrier layer 102 may include at least one of MgO ZnO, MgAlO, or aluminum oxide.

Free layer structure 104 is adjacent to tunnel barrier layer 62 and includes a free magnetic layer 106 and graded layer 108. Free magnetic layer 106 may be similar to or substantially the same as free magnetic layer 36 and/or free magnetic layer 66. For example, free magnetic layer 106 may include a CoFeB alloy. Graded layer 108 has graded magnetic anisotropy along the direction of arrow 110. For example, graded layer 108 may have perpendicular magnetic anisotropy that is greater adjacent to free magnetic layer 106 and lower away from free magnetic layer 106 (e.g., at the top of graded layer 108 in FIG. 6). In some examples, graded layer 108 may provide greater thermal stability compared to a free layer having uniform magnetic anisotropy (for a given switching current). Alternatively, graded layer 108 may facilitate use of a lower switching current for a given thermal stability.

In some examples, graded layer 108 may include a $L1_0$ FePd alloy, a $L1_0$ FePt alloy, a $L1_0$ CoPt alloy or a $L1_0$ CoPd alloy. Graded anisotropy may be created in graded layer 108 by controlling the composition, deposition parameters, and/or processing conditions (e.g., annealing temperature) of graded layer 108. For example, a composition ratio of 50:50 (atomic percent (at. %)) for $L1_0$ alloys may result in greater perpendicular anisotropy than a composition ratio that deviates from 50:50. In general, the $L1_0$ alloys may include between about 40 at. % Fe or Co and about 70 at. % Fe or Co.

As another example, perpendicular anisotropy of $L1_0$ alloys may increase (for a given composition) with increasing annealing or deposition temperatures. For example, a $L1_0$ alloy may have lower perpendicular anisotropy when deposited or annealed at a temperature of about 200° C. than when deposited or annealed at a temperature of about 500° C. In general, the deposition and/or annealing temperatures used for forming graded layer 108 may range between about 200° C. and about 500° C. By varying at least one of the composition, the deposition temperature, or the annealing temperature, graded layer 108 may be formed with perpendicular anisotropy that varies within graded layer 108.

In some examples, graded layer 108 may have a (001) crystal orientation texture, which may be similar to or substantially the same as the (001) crystal orientation texture of free magnetic layer 106 (e.g., when free magnetic layer 106 includes a CoFeB alloy) and tunnel barrier layer 102 (e.g., when tunnel barrier layer 102 includes MgO)

Although not shown in FIG. 6, in some examples, instead of including stack 92 of bilayers 94, MTJ 90 may include a layer of $L1_0$ Fe/Pd alloy, $L1_0$ FePt alloy, $L1_0$ CoPt alloy or $L1_0$ Co/Pd alloy adjacent to (e.g., below) fixed magnetic layer 100. In some examples, the layer of $L1_0$ Fe/Pd alloy, $L1_0$ FePt alloy, $L1_0$ CoPt alloy or $L1_0$ Co/Pd alloy includes a substantially homogeneous perpendicular magnetic anisotropy (e.g., substantially in the z-axis of FIG. 6). In other examples, the layer of $L1_0$ Fe/Pd alloy, $L1_0$ FePt alloy, $L1_0$ CoPt alloy or $L1_0$ Co/Pd alloy includes graded magnetic anisotropy (along the z-axis of FIG. 6).

MTJ 10, MTJ 50, and/or MTJ 90 may be used in any spintronic device, such as in a magnetic random access memory (MRAM) device using spin transfer torque, such as the MRAM devices described in U.S. Provisional Application Ser. No. 61/088,971, entitled "Exchange-Assisted Spin Transfer Torque Switching," filed on Aug. 14, 2008, the entire disclosure of which is incorporated by reference. Other spintronic devices that MTJ 10 may be used in include giant magnetoresistors (GMR), spin oscillators, magnetic sensors, and magnetic logic devices.

EXAMPLES

Examples 1 and 2

Perpendicular magnetic tunnel junction (PMTJ) structures were deposited by a six-target Shamrock ultrahigh vacuum sputtering system. A first PMTJ structure included a substrate; a 10 nanometer (nm) Pd underlayer; a fixed layer including a stack of five 0.3 nm Co/1 nm Pd bilayers and a $Co_{40}Fe_{40}B_{20}$ layer of about 2 nm; a 1 nm MgO tunnel barrier layer; a free layer including a $Co_{40}Fe_{40}B_{20}$ layer of about 2 nm, a 2 nm Pd layer, and a stack of three 0.3 nm Co/1 nm Pd bilayers; and a 3 nm Ta top layer. A second PMTJ structure included a substrate; a 10 nanometer (nm) Pd underlayer; a fixed layer including a stack of five 0.3 nm Co/1 nm Pd bilayers and a $Co_{40}Fe_{40}B_{20}$ layer of about 1.5 nm; a 1 nm MgO tunnel barrier layer; a free layer including a $Co_{40}Fe_{40}B_{20}$ layer of about 1.5 nm, a 2 nm Pd layer, and a stack of three 0.3 nm Co/1 nm Pd bilayers; and a 3 nm Ta top layer. The base pressure during sputtering was maintained below about $5 \times 10^{-8}$ Torr and a deposition pressure of about 1.5 milliTorr was used to deposit Co and Pd layers. The 1.5 milliTorr deposition pressure was found to produce sharp and defect-free interfaces between Co and Pd.

Figure 7:
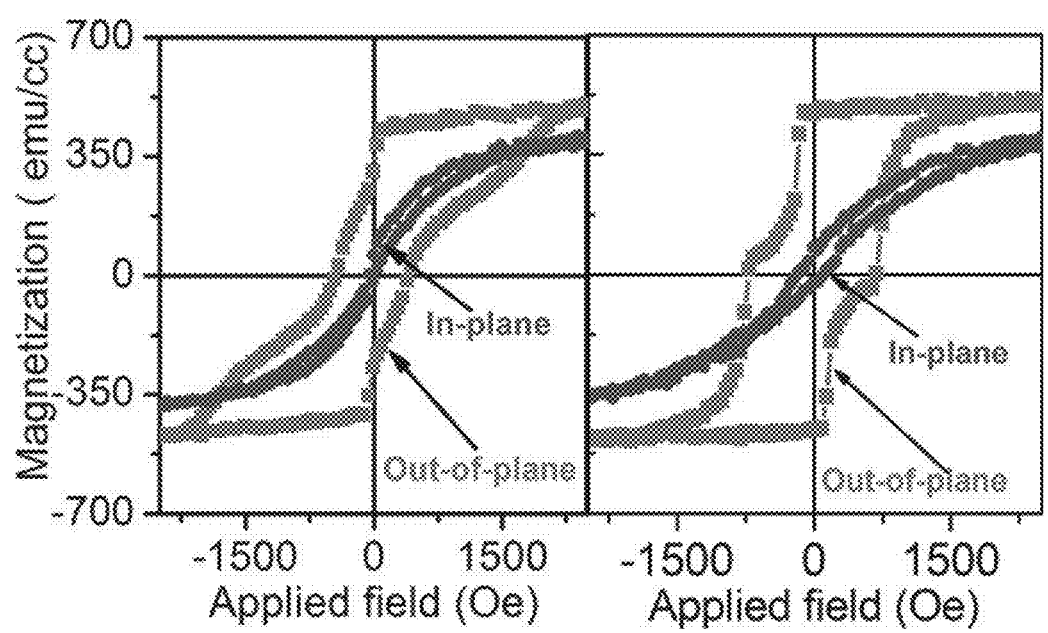
FIGS. 7A and 7B are plots that show hysteresis loops of magnetization versus applied magnetic field for perpendicular magnetic tunnel junction devices formed in accordance with aspects of this disclosure.

Magnetic properties of the structure were measured with a vibrating sample magnetometer. Results of the magnetic properties tests are shown in FIGS. 7A and 7B, which show loops of magnetization versus applied magnetic field of the first PMTJ structure and the second PMTJ structure, respectively. FIG. 7A shows that the M-H loops of the first PMTJ structure (having $Co_{40}Fe_{40}B_{20}$ layers of about 2 nm) show perpendicular anisotropy but do not exhibit sufficiently distinct switching from the fixed and free layers. FIG. 7B shows that the M-H loops of the second PMTJ structure (having $Co_{40}Fe_{40}B_{20}$ layers of about 1.5 nm) exhibit distinct switching from the fixed and free layers. While not wishing to be bound by theory, this may be because at a $Co_{40}Fe_{40}B_{20}$ layer thickness of less than or equal to about 1.5 nm, the interface anisotropy in the Co/Pd bilayers pulls the magnetic moment of the free layer and/or fixed layer out of the film plane (perpendicular anisotropy) more strongly than the $Co_{40}Fe_{40}B_{20}$ layer pulls the magnetic moment down into the film plane (parallel anisotropy).

Examples 3 and 4

The second PMTJ structure was then subjected to annealing testing to determine stability of the magnetic properties after annealing at different temperatures between 200° C. and 350° C. The second PMTJ structure included a substrate; a 10 nm Pd underlayer; a fixed layer including a stack of five 0.3 nm Co/1 nm Pd bilayers and a $Co_{40}Fe_{40}B_{20}$ layer of about 1.5 nm; a 1 nm MgO tunnel barrier layer; a free layer including a $Co_{40}Fe_{40}B_{20}$ layer of about 1.5 nm, a 2 nm Pd layer, and a stack of three 0.3 nm Co/1 nm Pd bilayers; and a 3 nm Ta top layer. The base pressure during sputtering was maintained below about $5 \times 10^{-8}$ Torr and a deposition pressure of about 1.5 milliTorr was used to deposit Co and Pd layers. The 1.5 milliTorr deposition pressure was found to produce sharp and defect-free interfaces between Co and Pd.

Figure 8:
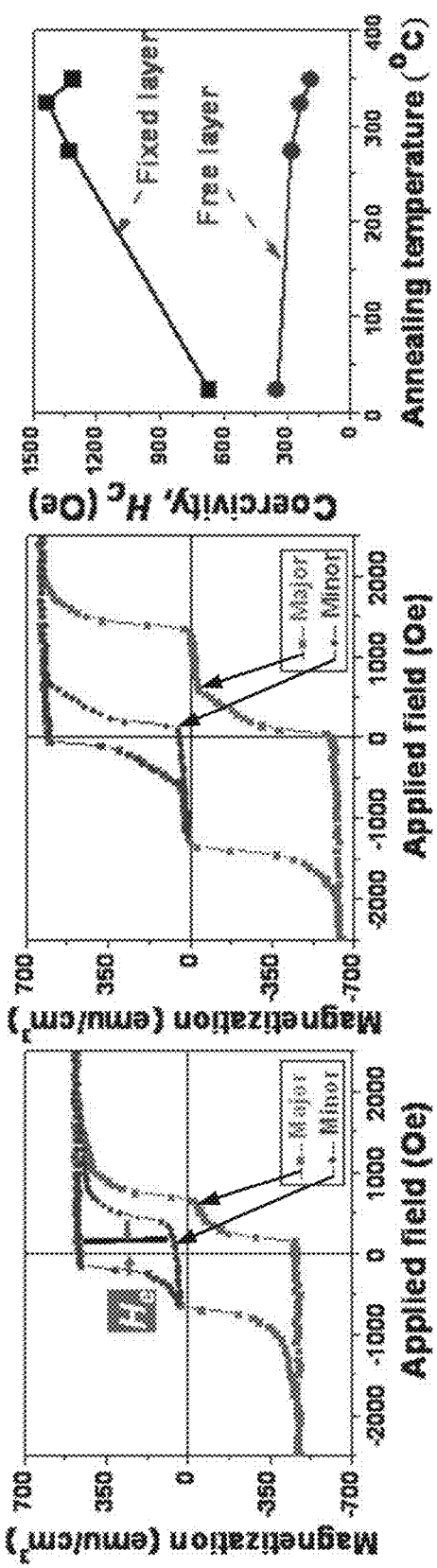
FIGS. 8A and 8B are plots that show the major (full loop) and minor (free layer only) magnetization versus applied magnetic field hysteresis loops of a perpendicular magnetic tunnel junction device after deposition and after annealing, respectively.
FIG. 8C is a plot of coercivity versus annealing temperature for the fixed layer and the free layer.

Magnetic properties of the structure were measured with a vibrating sample magnetometer. FIG. 8A shows the major (full loop) and minor (free layer only) hysteresis loops of the PMTJ after deposition (before annealing). FIG. 8B shows the major (full loop) and minor (free layer only) hysteresis loops of PMTJ after annealing the structure at 350° C. for about 1 hour in a vacuum. The major hysteresis loops in both FIGS. 8A and 8B show distinct switching from both the free layer and fixed layer. The near unity perpendicular squareness ratio indicates the presence of substantially complete perpendicular anisotropy in both the free layer and the fixed layer after annealing at 350° C. for 1 hour. The coercivity ($H_c$) of the fixed layer in the as-deposited sample (FIG. 8A) is about 670 Oe, while the coercivity ($H_c$) of the free layer in the as-deposited sample (FIG. 8A) is about 350 Oe. The coercivity ($H_c$) of the fixed layer in the annealed sample (FIG. 8B) is about 1300 Oe, while the coercivity ($H_c$) of the free layer in the annealed sample (FIG. 8B) is about 180 Oe.

FIG. 8C is a plot of coercivity versus annealing temperature for the fixed layer and the free layer. FIG. 8C shows that the coercivity of the fixed layer increases with increasing annealing temperature up to about 300° C. then decreases slightly. FIG. 8C also shows that the coercivity of the free layer decreases with increasing annealing temperature. Although not wishing to be bound by theory, the change of coercivity after annealing for both the free layer and the fixed layer may be explained by changes in the (111) texture in the Co/Pd multilayers. For example, it is believed that the (111) texture of the bottom Co/Pd layers (of the fixed layer) improves upon annealing due to the larger number of layer repetitions and the relatively thick (10 nm) Pd underlayer. On the other hand, it is believed that the (111) texture of the top Co/Pd layers (of the free layer) degrades upon annealing due to a template effect from the underlaying (001) oriented MgO.

FIG. 8A also shows that the exchange field ($H_e$), which is represented by the shifting (offset from zero to the negative magnetic field direction) of the minor loop, decreases from 125 Oe to 30 Oe upon annealing. While not wishing to be bound by theory, this may be due to improvement of the MgO barrier upon annealing.

Examples 5 and 6

Figure 9:
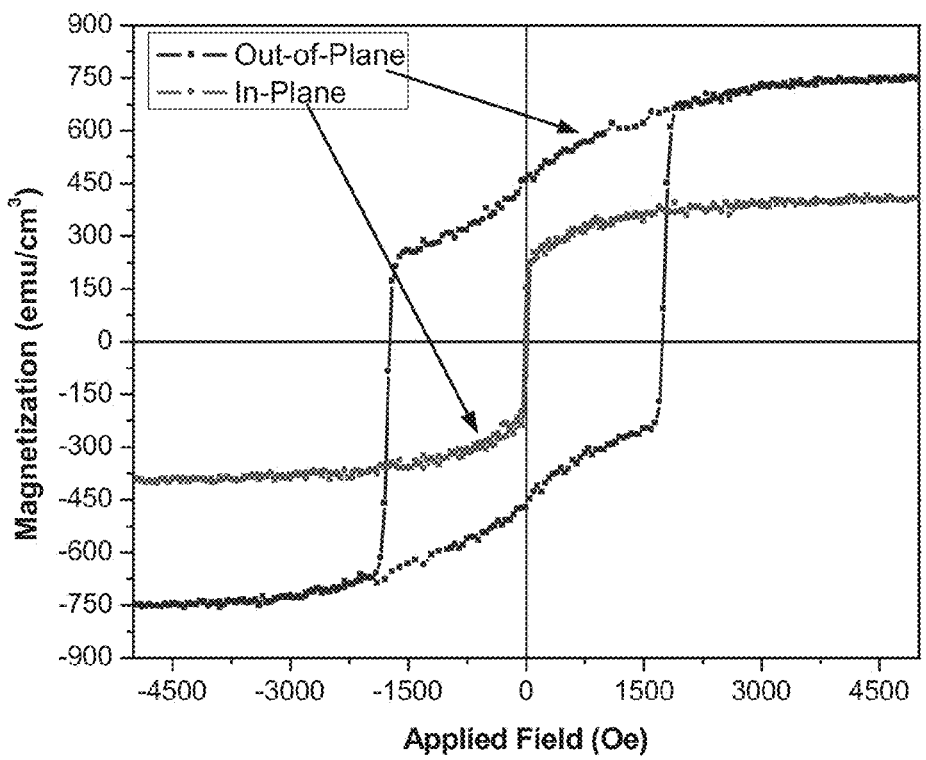
FIG. 9 is a plot of magnetization versus applied field hysteresis loop for an as-deposited perpendicular magnetic tunnel junction device formed in accordance with aspects of this disclosure.
Figure 10:
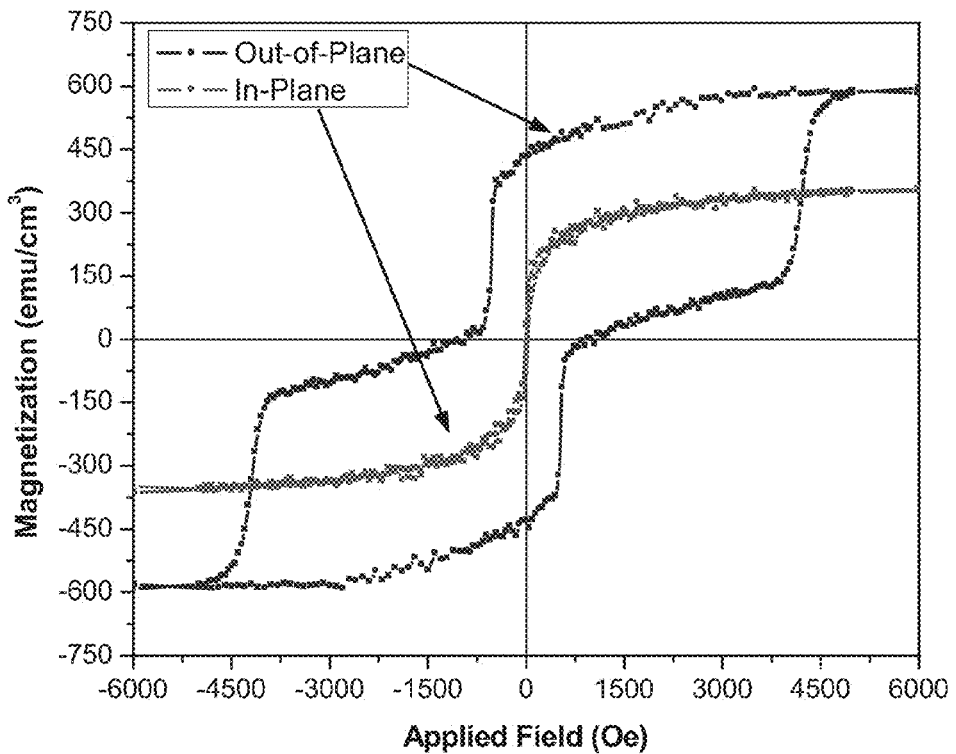
FIG. 10 is a plot of magnetization versus applied field hysteresis loop for the perpendicular magnetic tunnel junction device of FIG. 9 after annealing the perpendicular magnetic tunnel junction device for about 1 hour at 300° C.

A PMTJ was formed that included substrate; a fixed layer including a stack of five 0.35 nm Co/1 nm Pd bilayers, a 0.5 nm Ta interlayer, and a 1.5 nm $Co_{40}Fe_{40}B_{20}$ layer; a 1.5 nm MgO tunnel barrier layer; a free layer including a 1.5 nm $Co_{40}Fe_{40}B_{20}$ layer, an interlayer including a 0.5 nm Ta layer and a 2 nm Pd layer, and a stack of three 0.35 nm Co/1 nm Pd bilayers; and top layers of 2 nm Pd and 5 nm Ru. FIG. 9 shows a hysteresis loop of magnetization versus applied field for the as-deposited PMTJ. FIG. 10 shows a hysteresis loop of magnetization versus applied field for the PMTJ after annealing at 350° C. for about 1 hour in a vacuum. As shown in FIG. 9, the 2 nm Pd between Ta and the Co/Pd bilayers in the free layer was too thick to maintain exchange coupling between the $Co_{40}Fe_{40}B_{20}$ layer and the Co/Pd bilayers before annealing.

Examples 7 and 8

Figure 11:
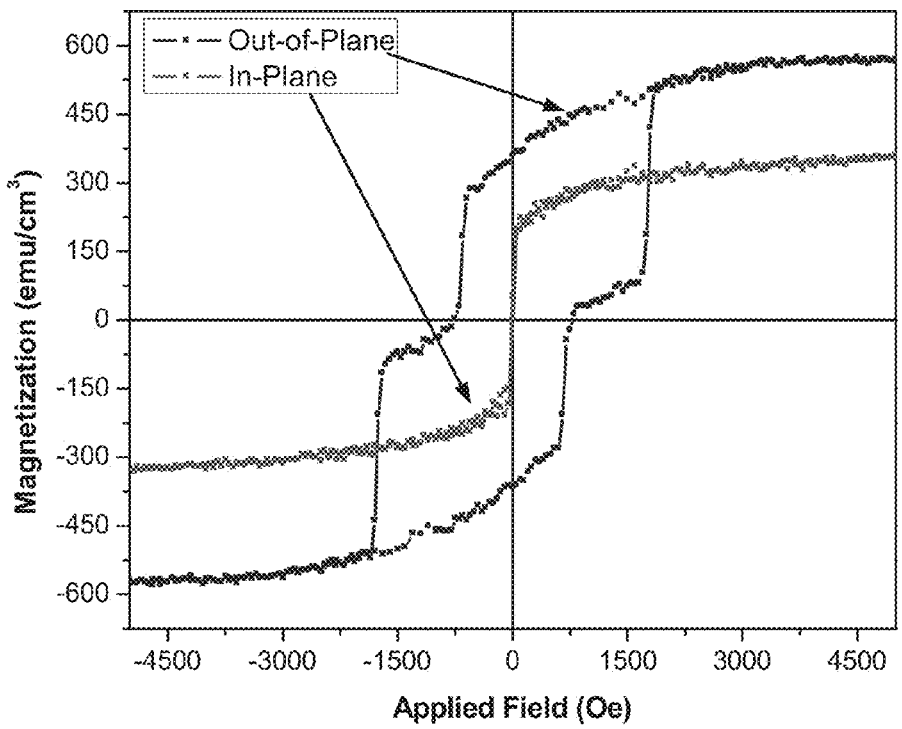
FIG. 11 is a plot of magnetization versus applied field hysteresis loop for an as-deposited perpendicular magnetic tunnel junction device formed in accordance with aspects of this disclosure.
Figure 12:
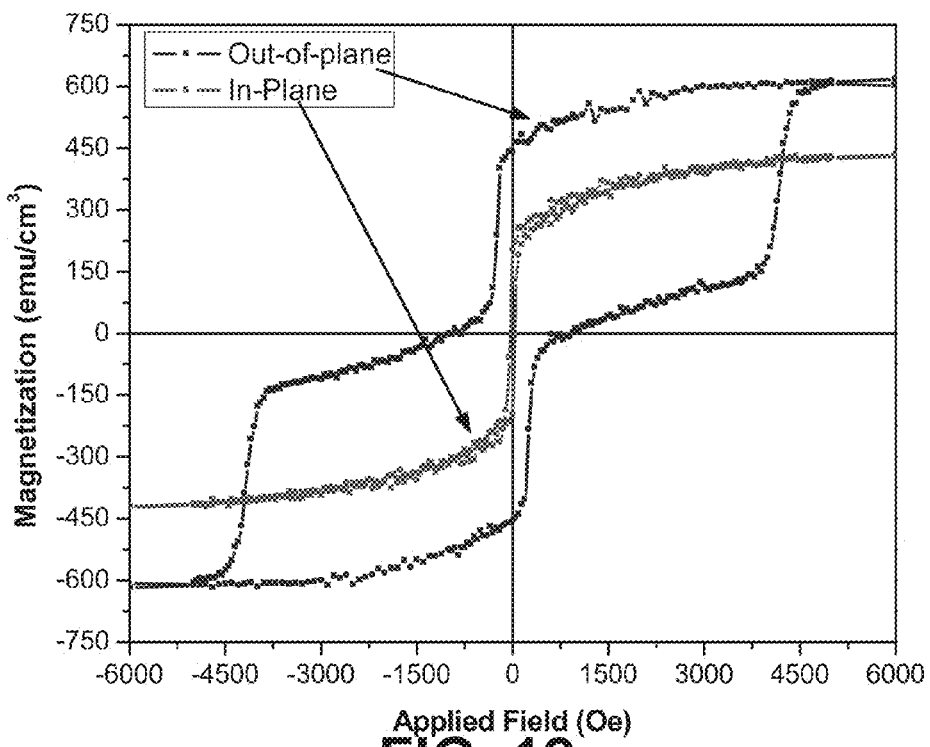
FIG. 12 is a plot of magnetization versus applied field hysteresis loop for the perpendicular magnetic tunnel junction device of FIG. 11 after annealing the perpendicular magnetic tunnel junction device for about 1 hour at 350° C.

A PMTJ was formed that included substrate; a fixed layer including a stack of five 0.35 nm Co/1 nm Pd bilayers, a 0.5 nm Ta interlayer, and a 1.5 nm $Co_{40}Fe_{40}B_{20}$ layer; a 1.5 nm MgO tunnel barrier layer; a free layer including a 1.5 nm $Co_{40}Fe_{40}B_{20}$ layer, an interlayer including a 0.5 nm Ta layer and a 1.5 nm Pd layer, and a stack of three 0.35 nm Co/1 nm Pd bilayers; and top layers of 2 nm Pd and 5 nm Ru. FIG. 11 shows a hysteresis loop of magnetization versus applied field for the as-deposited PMTJ. FIG. 12 shows a hysteresis loop of magnetization versus applied field for the PMTJ after annealing at 350° C. for about 1 hour in a vacuum. As shown in FIGS. 11 and 12, a 1.5 nm Pd layer between Ta and the Co/Pd bilayers in the free layer is sufficiently thin to maintain exchange coupling between the $Co_{40}Fe_{40}B_{20}$ layer and the Co/Pd bilayers, both before and after annealing. However, some perpendicular magnetic anisotropy is lost in the free layer after annealing.

Examples 9 and 10

Figure 13:
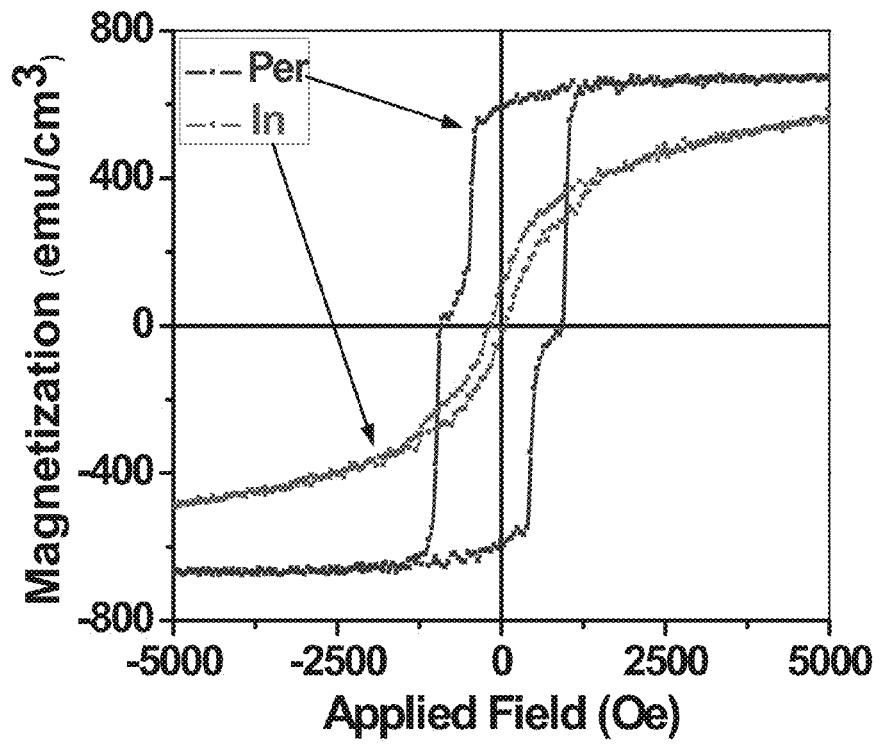
FIG. 13 is a plot of magnetization versus applied field hysteresis loop for an as-deposited perpendicular magnetic tunnel junction device formed in accordance with aspects of this disclosure.
Figure 14:
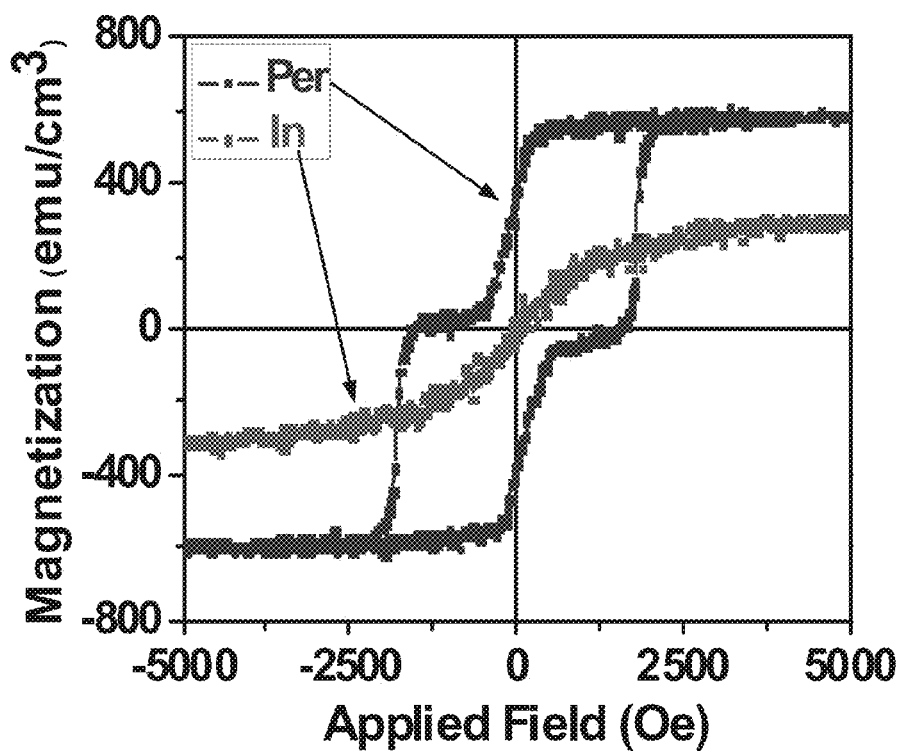
FIG. 14 is a plot of magnetization versus applied field hysteresis loop for the perpendicular magnetic tunnel junction device of FIG. 13 after annealing the perpendicular magnetic tunnel junction device for about 1 hour at 350° C.

A PMTJ was formed that included substrate; a fixed layer including a stack of five 0.35 nm Co/1 nm Pd bilayers, a 0.5 nm Au interlayer, and a 1.5 nm $Co_{40}Fe_{40}B_{20}$ layer; a 1.5 nm MgO tunnel barrier layer; a free layer including a 1.5 nm $Co_{40}Fe_{40}B_{20}$ layer, an interlayer including a 0.5 nm Au layer and a 1.5 nm Pd layer, and a stack of three 0.35 nm Co/1 nm Pd bilayers; and top layers of 2 nm Pd and 5 nm Ru. FIG. 13 shows a hysteresis loop of magnetization versus applied field for the as-deposited PMTJ. FIG. 14 shows a hysteresis loop of magnetization versus applied field for the PMTJ after annealing at 350° C. for about 1 hour in a vacuum. As shown in FIGS. 13 and 14, a 0.5 nm Au layer and a 1.5 nm Pd layer between the $Co_{40}Fe_{40}B_{20}$ layer and the Co/Pd bilayers in the free layer are sufficiently thin to maintain exchange coupling between the $Co_{40}Fe_{40}B_{20}$ layer and the Co/Pd bilayers. However, some perpendicular magnetic anisotropy is lost in the free layer after annealing, as shown in FIG. 14.

Examples 11-15

Figure 15:
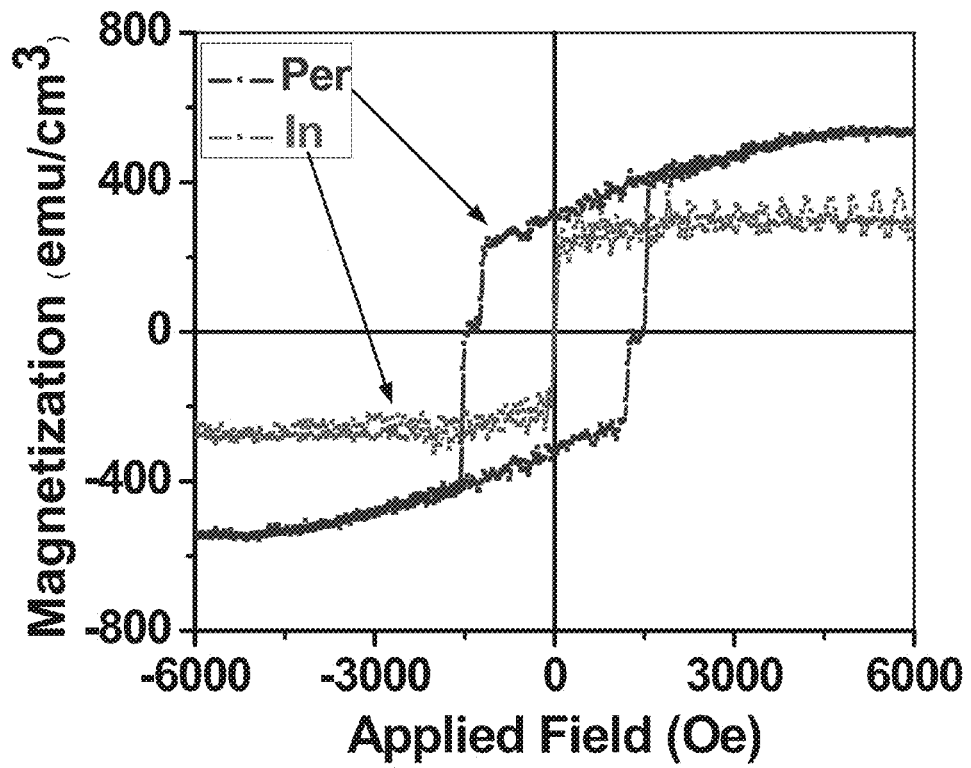
FIGS. 15-19 are plots of magnetization versus applied field hysteresis loop for an as-deposited perpendicular magnetic tunnel junction devices formed in accordance with aspects of this disclosure.
Figure 16:
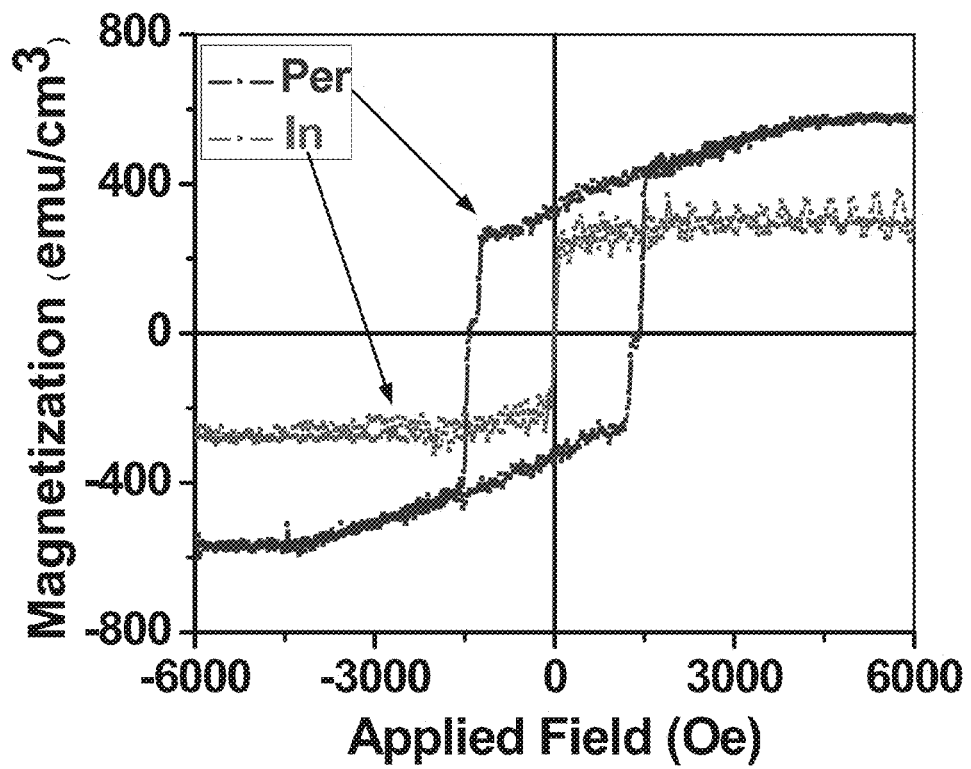
Figure 17:
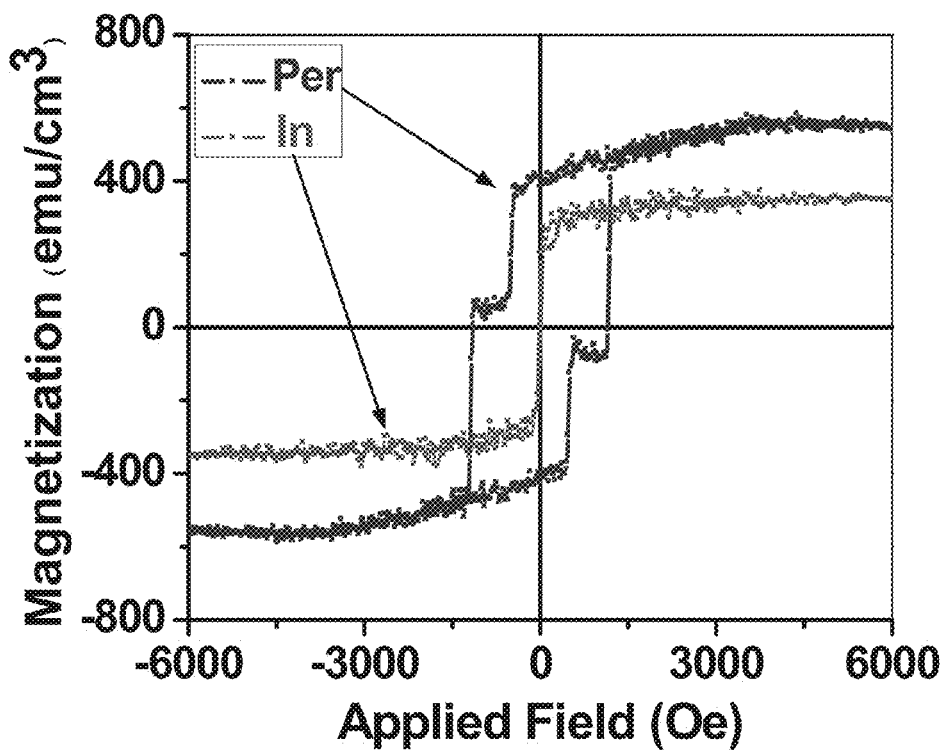
Figure 18:
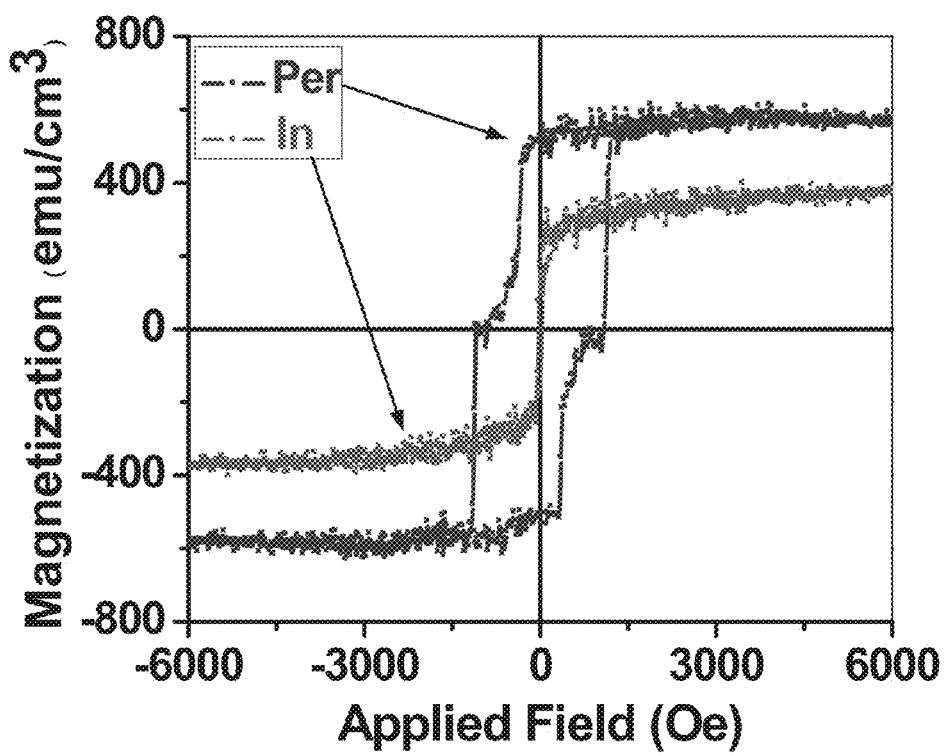
Figure 19:
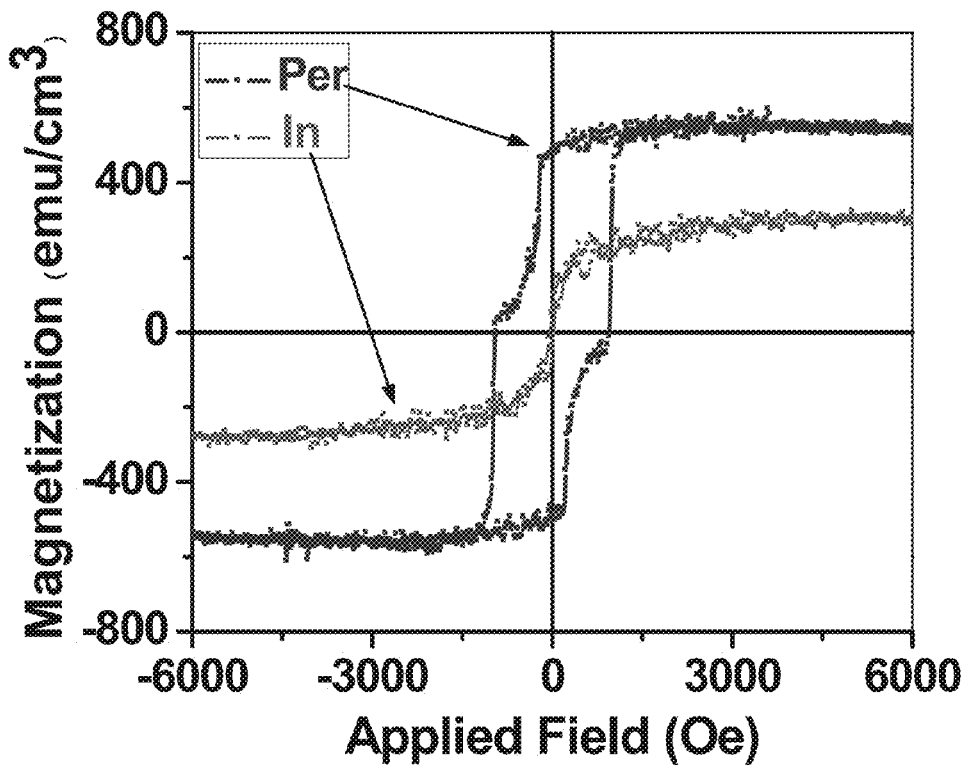

A PMTJ was formed that included substrate; a fixed layer including a stack of five 0.35 nm Co/1 nm Pd bilayers, a 0.5 nm Ru interlayer, and a 1.5 nm $Co_{40}Fe_{40}B_{20}$ layer; a 1.5 nm MgO tunnel barrier layer; a free layer including a 1.5 nm $Co_{40}Fe_{40}B_{20}$ layer, an interlayer including a 0.5 nm Ru layer and a 1.5 nm Pd layer, and a stack of three 0.35 nm Co/1 nm Pd bilayers; and top layers of 2 nm Pd and 5 nm Ru. FIG. 15 shows a hysteresis loop of magnetization versus applied field for the as-deposited PMTJ. As shown in FIG. 15, a 0.5 nm Ru layer and a 1.5 nm Pd layer between Ta and the Co/Pd bilayers in the free layer are sufficiently thin to maintain exchange coupling between the $Co_{40}Fe_{40}B_{20}$ layer and the Co/Pd bilayers.

FIGS. 16-19 show hysteresis curves for PMTJs having substantially similar structures as that tested in FIG. 15. However, in FIGS. 16-19, the 0.5 nm Ru interlayer was replaced with a 0.4 nm Ru interlayer, a 0.3 nm Ru interlayer, a 0.25 nm Ru interlayer, and a 0.2 nm Ru interlayer, respectively. As shown in FIGS. 16-19, the 0.4 nm Ru interlayer, the 0.3 nm Ru interlayer, the 0.25 nm Ru interlayer, and the 0.2 nm Ru interlayer were each sufficiently thin to maintain exchange coupling between the $Co_{40}Fe_{40}B_{20}$ layer and the Co/Pd bilayers.

Examples 16-18

A PMTJ was formed that included substrate; a fixed layer including a stack of five 0.35 nm Co/1 nm Pd bilayers, a 0.3 nm Ru interlayer, and a 1.5 nm $Co_{40}Fe_{40}B_{20}$ layer; a 1.5 nm MgO tunnel barrier layer; a free layer including a 1.5 nm $Co_{40}Fe_{40}B_{20}$ layer, an interlayer including a 0.3 nm Ru layer and a 1.5 nm Pd layer, and a stack of three 0.35 nm Co/1 nm Pd bilayers; and top layers of 2 nm Pd and 5 nm Ru.

Figure 20:
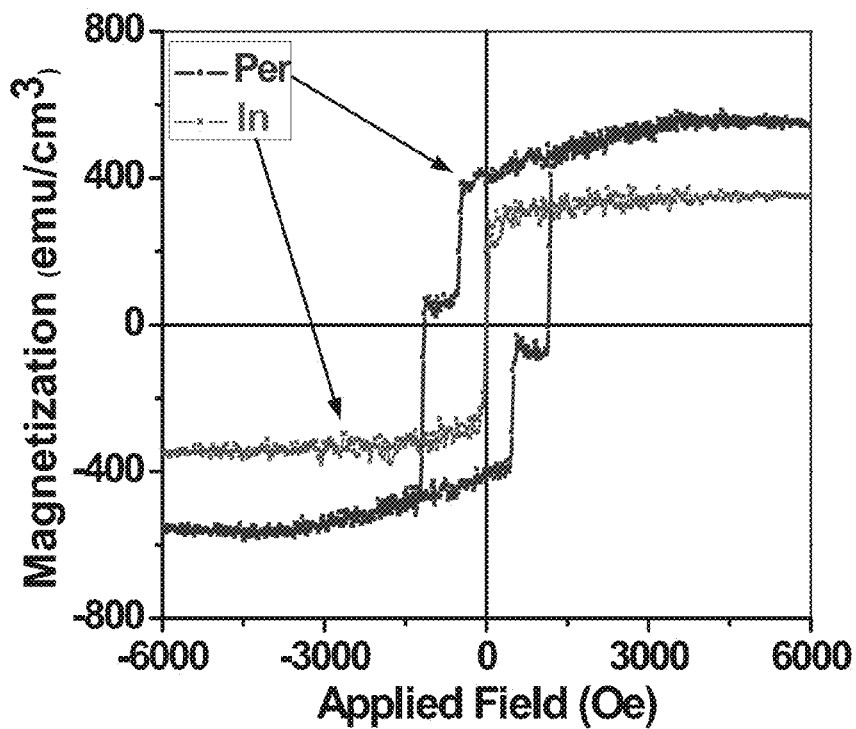
FIGS. 20-22 are plots of magnetization versus applied field hysteresis loop for an perpendicular magnetic tunnel junction devices formed in accordance with aspects of this disclosure.
Figure 21:
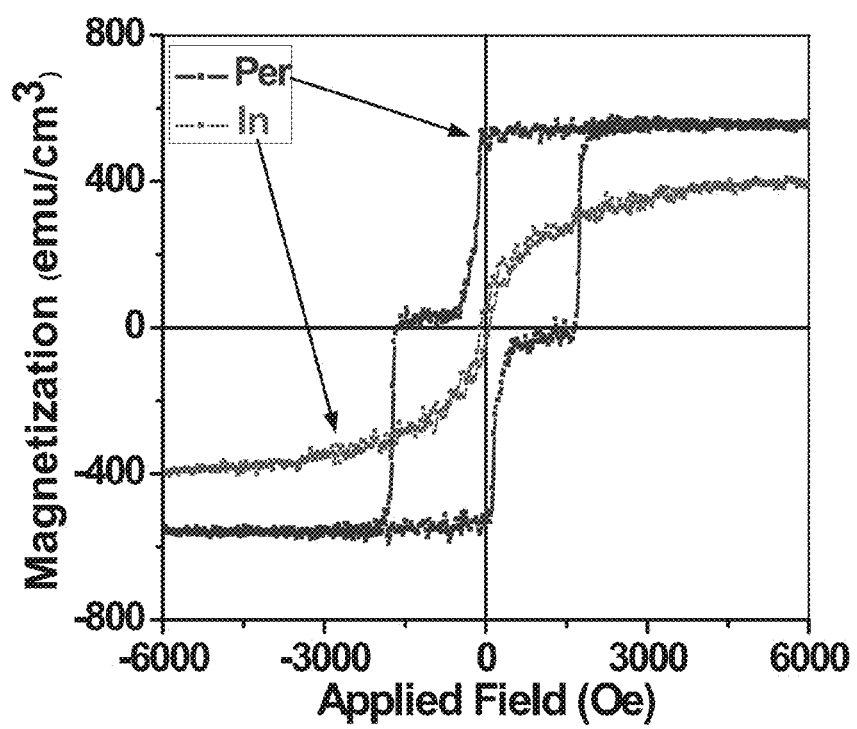
Figure 22:
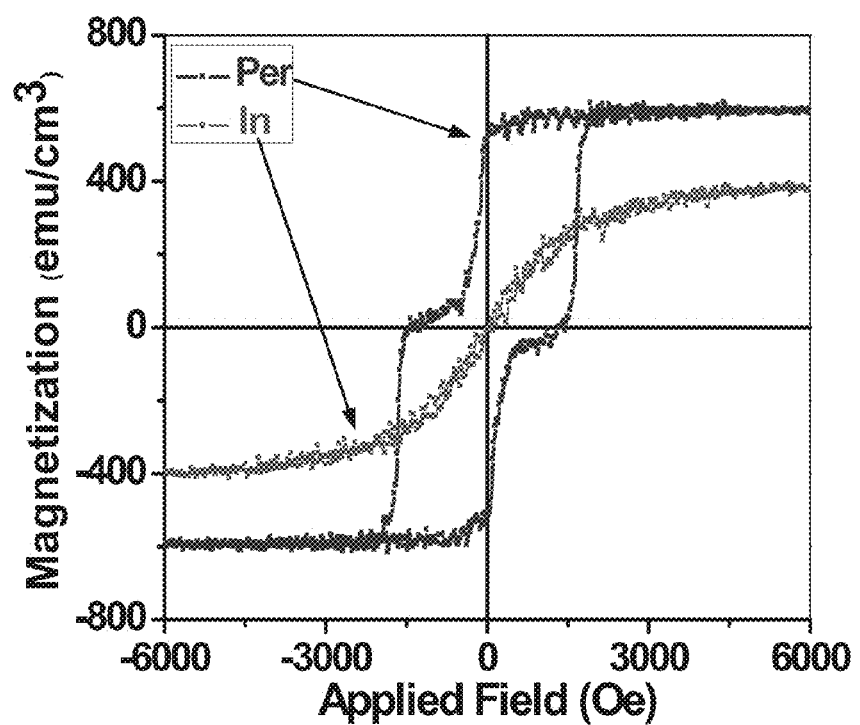

FIG. 20 shows a hysteresis loop of magnetization versus applied field for the as-deposited PMTJ. FIG. 21 shows a hysteresis loop of magnetization versus applied field for the PMTJ after annealing at about 300° C. for about 1 hour. FIG. 22 shows a hysteresis loop of magnetization versus applied field for the PMTJ after annealing at about 350° C. for about 1 hour. FIGS. 20-22 show that the 0.3 nm Ru interlayer was sufficiently thin to maintain exchange coupling between the $Co_{40}Fe_{40}B_{20}$ layer and the Co/Pd bilayers and to maintain perpendicular magnetic anisotropy in the free layer after annealing at 300° C. and 350° C.

Various examples of the invention have been described. These and other examples are within the scope of the following claims.

The invention claimed is:

1. A magnetic tunnel junction device comprising:
a fixed magnetic layer having a first side and a second side, the fixed magnetic layer having a magnetic anisotropy that is out of the film plane of the fixed magnetic layer;
a stack of a plurality of bilayers adjacent to the first side of the fixed magnetic layer, each bilayer comprising a first layer comprising at least one of cobalt, iron, a CoFeB alloy, or a CoB alloy and a second layer in contact with the first layer, the second layer comprising palladium or platinum, wherein the plurality of bilayers has a magnetic anisotropy that is out of the film plane of each of the bilayers;
wherein the fixed magnetic layer is exchange coupled to the stack of the plurality of bilayers; and
a tunnel barrier layer in contact with the second side of the fixed magnetic layer.

2. The magnetic tunnel junction device of claim 1, wherein the fixed magnetic layer has a magnetic anisotropy that is generally perpendicular to the film plane of the fixed magnetic layer, and wherein the stack of the plurality of bilayers has a magnetic anisotropy that is generally perpendicular to the film plane of each of the bilayers.

3. The magnetic tunnel junction device of claim 1, wherein the tunnel barrier layer comprises at least one of MgO, ZnO, MgAlO, or $Al_2O_3$.

4. The magnetic tunnel junction device of claim 1, wherein the fixed magnetic layer comprises a CoFeB alloy.

5. The magnetic tunnel junction device of claim 1, wherein the fixed magnetic layer and the stack of the plurality of bilayers maintain generally perpendicular magnetic anisotropy at a temperature of at least about 300° C.

6. The magnetic tunnel junction device of claim 1, wherein the stack of the plurality of bilayers comprises between 1 and 10 bilayers.

7. The magnetic tunnel junction device of claim 1, wherein each bilayer of the stack of the plurality of bilayers comprises a cobalt layer having a thickness of between about 0.2 nm and about 0.4 nm, and a palladium layer having a thickness of between about 1 nm and about 1.5 nm in contact with the cobalt layer.

8. The magnetic tunnel junction device of claim 1, further comprising an interlayer comprising at least one of cobalt, tantalum, ruthenium, a CoFe alloy, or chromium between the fixed magnetic layer and the stack of the plurality of bilayers, wherein the interlayer has a thickness of between about 0.3 nm and about 0.6 nm.

9. The magnetic tunnel junction device of claim 1, wherein the fixed magnetic layer and the stack of the plurality of bilayers forms a single domain state.

10. The magnetic tunnel junction device of claim 1, further comprising a free magnetic layer in contact with the tunnel barrier layer on a side opposite the fixed magnetic layer.

11. The magnetic tunnel junction device of claim 10, wherein the free magnetic layer comprises a FeCoB alloy.

12. The magnetic tunnel junction device of claim 10, wherein the direction of magnetization of the free magnetic layer may move between a first state and a second state, wherein a magnetoresistive ratio is formed between a resistance through the magnetic tunnel junction device when the free magnetic layer is in the first state and a resistance through the magnetic tunnel junction device when the free magnetic layer is in the second state, wherein the magnetoresistive ratio is between about 30% and about 75%.

13. The magnetic tunnel junction device of claim 10, wherein the free magnetic layer comprises a layer including a FeCoB alloy and a layer comprising graded perpendicular magnetic anisotropy.

14. The magnetic tunnel junction device of claim 13, wherein the layer comprising the graded perpendicular magnetic anisotropy comprises at least one of a $L1_0$ FePt alloy, a $L1_0$ FePd alloy, a $L1_0$ CoPt alloy, or a $L1_0$ CoPd alloy.

15. The magnetic tunnel junction device of claim 10, wherein the free magnetic layer comprises a layer including a FeCoB alloy and a plurality of bilayers adjacent the layer including the FeCoB alloy, wherein each of the plurality of bilayers is separated by an interlayer.

16. The magnetic tunnel junction device of claim 15, wherein the plurality of bilayers comprises a graded perpendicular magnetic anisotropy, wherein a perpendicular magnetic anisotropy of a first bilayer adjacent to the layer including the FeCoB alloy is greater than a perpendicular magnetic anisotropy of a second bilayer located farther away from the layer including the FeCoB alloy than the first bilayer.

17. The magnetic tunnel junction device of claim 1, wherein the exchange coupling between the fixed magnetic layer and the stack of the plurality of bilayers has an exchange coupling energy of between about $1 \times 10^{-13}$ J/m and about $1 \times 10^{-11}$ J/m.

18. A method of forming a magnetic tunnel junction device, the method comprising:
   forming a fixed magnetic layer having a first side and a second side, the fixed magnetic layer having a magnetic anisotropy that is out of the film plane of the fixed magnetic layer;
   forming a stack of a plurality of bilayers adjacent to the first side of the fixed magnetic layer, each bilayer comprising a first layer comprising at least one of cobalt, iron, a CoFeB alloy, or a CoB alloy and a second layer in contact with the first layer, the second layer comprising palladium or platinum, wherein the plurality of bilayers has a magnetic anisotropy that is out of the film plane of each of the bilayers;
   wherein the fixed magnetic layer is exchange coupled to the stack of the plurality of bilayers; and
   forming a tunnel barrier layer in contact with the second side of the fixed magnetic layer.

19. The method of claim 18, wherein the fixed magnetic layer has a magnetic anisotropy that is generally perpendicular to the film plane of the fixed magnetic layer, and wherein the stack of the plurality of bilayers has a magnetic anisotropy that is generally perpendicular to the film plane of each of the bilayers.

20. The method of claim 18, wherein forming the stack of the plurality of bilayers comprises depositing cobalt layers and palladium layers at a deposition pressure of below about 2 mTorr.

21. The method of claim 18, further comprising annealing the fixed magnetic layer, the stack of the plurality of bilayers, and the tunnel barrier layer.

22. The method of claim 21, wherein forming the fixed magnetic layer comprises depositing a magnetic material in an amorphous state, wherein the annealing crystallizes the magnetic material into a (001) crystal orientation texture, wherein forming the tunnel barrier layer comprises depositing a tunnel barrier material, and wherein the annealing crystallizes the tunnel barrier material into a (001) crystal orientation texture.

23. The method of claim 21, wherein the annealing is performed at between about 270° C. and about 375° C., for between about 0.5 hours and about 2 hours.

24. The method of claim 23, wherein the fixed magnetic layer and the stack of the plurality of bilayers maintain generally perpendicular magnetic anisotropy during the annealing.

25. The method of claim 18, wherein the tunnel barrier layer comprises at least one of MgO, ZnO, MgAlO, or $Al_2O_3$, and wherein the fixed magnetic layer comprises a CoFeB alloy.

26. The method of claim 18, further comprising forming an interlayer comprising at least one of cobalt, tantalum, ruthenium, a CoFe alloy, or chromium between the fixed magnetic layer and the stack of the plurality of bilayers.

27. The method of claim 18, wherein forming the stack of the plurality of bilayers comprises sequentially forming between 1 and 10 bilayers.

28. The method of claim 18, wherein each bilayer of the stack of the plurality of bilayers comprises a cobalt layer having a thickness between about 0.2 nm and about 0.4 nm, and a palladium layer having a thickness of between about 1 nm and about 1.5 nm in contact with the cobalt layer.

29. The method of claim 18, wherein the fixed magnetic layer and the stack of the plurality of bilayers are formed with a single domain state.

30. The method of claim 18, further comprising forming a free magnetic layer in contact with the tunnel barrier layer on a side opposite the fixed magnetic layer.

31. The method of claim 30, wherein the free magnetic layer comprises a FeCoB alloy.

32. The method of claim 30, wherein the direction of magnetization of the free magnetic layer may move between a first state and a second state, wherein a magnetoresistive ratio is formed between a resistance through the magnetic tunnel junction device when the free magnetic layer is in the first state and a resistance through the magnetic tunnel junction device when the free magnetic layer is in the second state, wherein the magnetoresistive ratio is between about 30% and about 75%.

33. The method of claim 30, wherein the free magnetic layer comprises a layer including a FeCoB alloy in contact with the tunnel barrier layer and a layer comprising graded perpendicular magnetic anisotropy on a side opposite the tunnel barrier layer.

34. The method of claim 33, wherein the layer comprising the graded perpendicular magnetic anisotropy comprises at least one of a $L1_0$ FePt alloy, a $L1_0$ FePd alloy, a $L1_0$ CoPt alloy, or a $L1_0$ CoPd alloy.

35. The method of claim 30, wherein the free magnetic layer comprises a layer including a FeCoB alloy in contact with the tunnel barrier layer and a plurality of bilayers adjacent the layer including the FeCoB alloy, wherein each of the plurality of bilayers is separated by an interlayer.

36. The method of claim 35, wherein the plurality of bilayers comprises a graded perpendicular magnetic anisotropy, wherein a perpendicular magnetic anisotropy of a first bilayer adjacent to the layer including the FeCoB alloy is greater than a perpendicular magnetic anisotropy of a second bilayer located farther away from the layer including the FeCoB alloy than the first bilayer.

37. The method of claim 18, wherein the exchange coupling between the fixed magnetic layer and the stack of the plurality of bilayers has an exchange coupling energy of between about $1 \times 10^{-13}$ J/m and about $1 \times 10^{-11}$ J/m.

* * * * *